(12) United States Patent
Saito et al.

(10) Patent No.: US 8,760,213 B2
(45) Date of Patent: Jun. 24, 2014

(54) RAMP SIGNAL OUTPUT CIRCUIT, ANALOG-TO-DIGITAL CONVERSION CIRCUIT, IMAGING DEVICE, METHOD FOR DRIVING RAMP SIGNAL OUTPUT CIRCUIT, METHOD FOR DRIVING ANALOG-TO-DIGITAL CONVERSION CIRCUIT, AND METHOD FOR DRIVING IMAGING DEVICE

(71) Applicant: Canon Kabushiki Kaisha, Tokyo (JP)

(72) Inventors: Kazuhiro Saito, Tokyo (JP); Hiroki Hiyama, Sagamihara (JP); Tetsuya Itano, Sagamihara (JP); Kohichi Nakamura, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 85 days.

(21) Appl. No.: 13/628,365

(22) Filed: Sep. 27, 2012

(65) Prior Publication Data

US 2013/0087688 A1   Apr. 11, 2013

(30) Foreign Application Priority Data

Oct. 7, 2011   (JP) ................................. 2011-223298

(51) Int. Cl.
*H03K 4/06* (2006.01)
*H03M 1/56* (2006.01)
*H03K 4/08* (2006.01)
*H03K 4/50* (2006.01)

(52) U.S. Cl.
CPC .. *H03K 4/06* (2013.01); *H03K 4/08* (2013.01); *H03K 4/50* (2013.01); *H03M 1/56* (2013.01)
USPC ............................ 327/408; 327/406; 341/169

(58) Field of Classification Search
CPC ............. H03K 4/06; H03K 4/08; H03K 4/50; H03K 4/501; H03K 5/502; H03M 1/56
USPC ........... 341/164, 165, 169; 327/131, 132, 140
See application file for complete search history.

(56) References Cited

U.S. PATENT DOCUMENTS

| | | | |
|---|---|---|---|
| 4,078,252 A | 3/1978 | Schoenfeld | |
| 4,127,810 A * | 11/1978 | Purland | ........................ 324/99 D |
| 6,586,980 B1 | 7/2003 | Callahan, Jr. | |
| 7,026,972 B2 * | 4/2006 | Isomura | ........................ 341/155 |
| 7,479,916 B1 | 1/2009 | Reshef | |
| 7,864,094 B2 * | 1/2011 | Kitami | ........................ 341/169 |
| 2004/0021787 A1 | 2/2004 | Cho | |
| 2005/0168251 A1 | 8/2005 | Lim | |
| 2008/0111591 A1 * | 5/2008 | Mori | ............................ 327/135 |
| 2008/0231330 A1 | 9/2008 | Takahashi | |
| 2009/0079603 A1 * | 3/2009 | Maruyama | .................... 341/122 |
| 2010/0259660 A1 * | 10/2010 | Kukita | .......................... 348/308 |

FOREIGN PATENT DOCUMENTS

JP   2008-187420 A   8/2008

* cited by examiner

*Primary Examiner* — Howard Williams
(74) *Attorney, Agent, or Firm* — Canon USA, Inc. IP Division

(57) ABSTRACT

A circuit configured to output a ramp signal having a potential varying depending on time includes a voltage supply unit configured to supply a plurality of voltages having different amplitudes, a current supply unit, an integration circuit configured to output the ramp signal, and a capacitive element. The voltage supply unit is connected to one terminal of the capacitive element. The integration circuit and the current supply unit are connected to another terminal of the capacitive element.

20 Claims, 19 Drawing Sheets

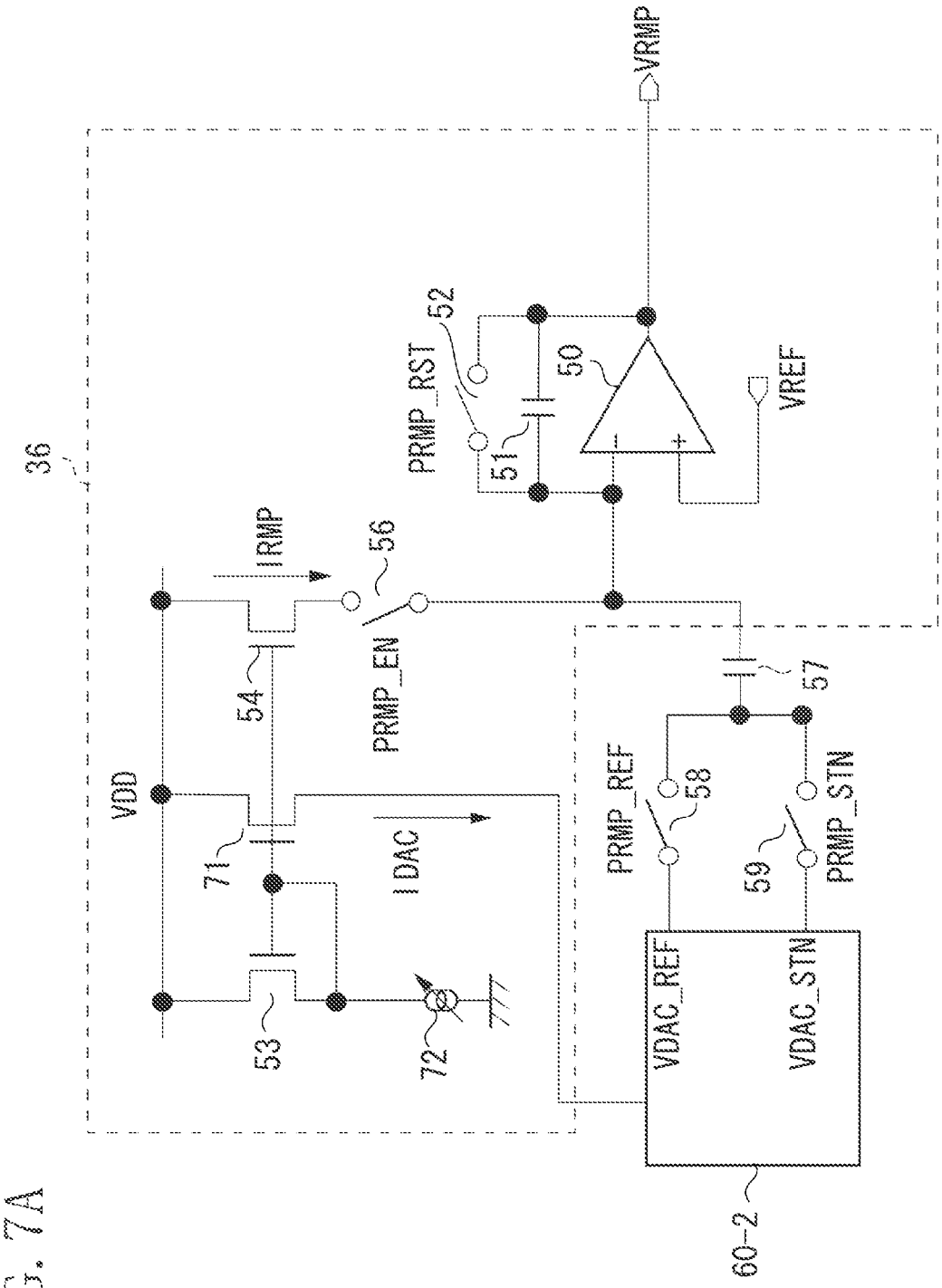

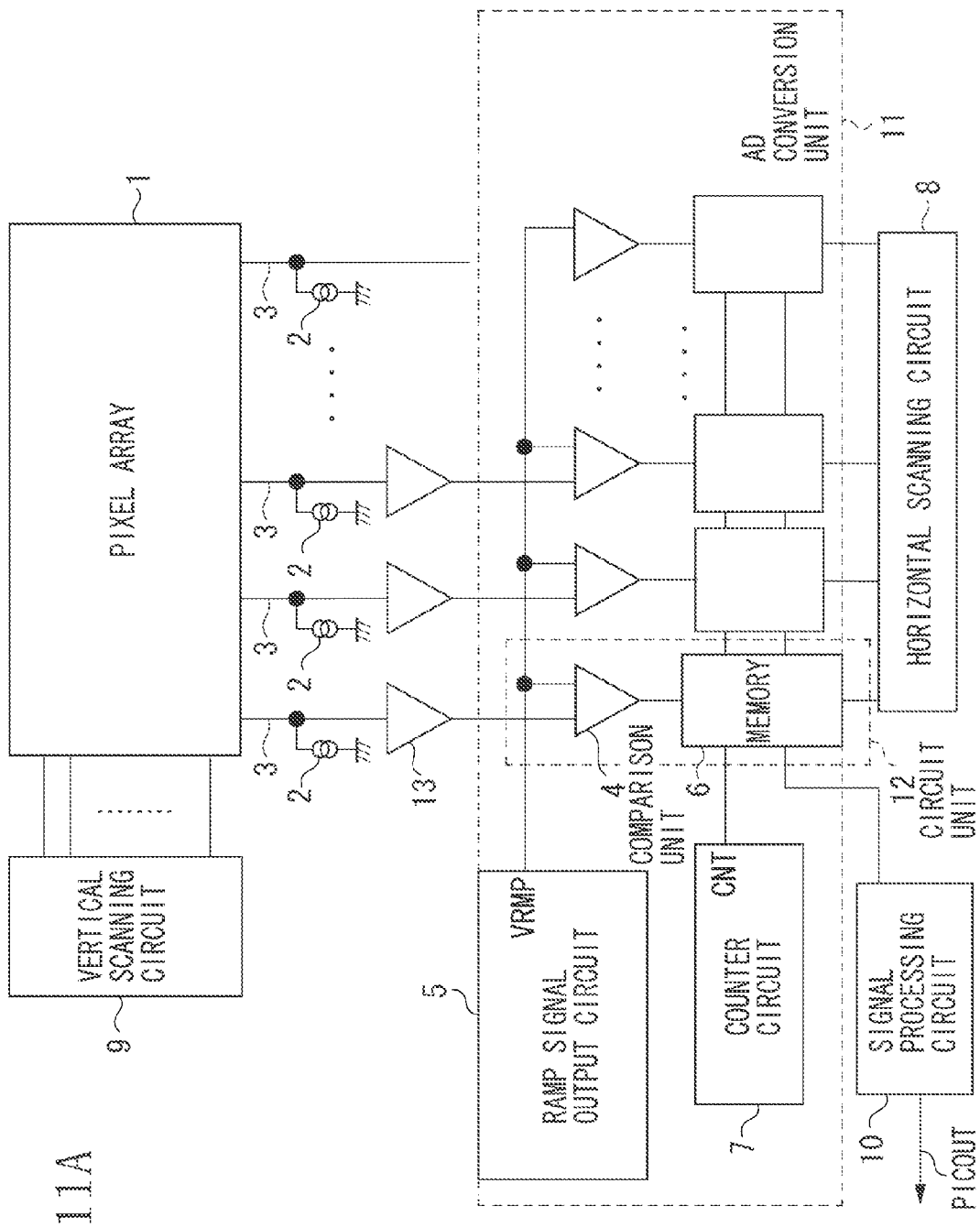

RAMP SIGNAL OUTPUT CIRCUIT, ANALOG-TO-DIGITAL CONVERSION CIRCUIT, IMAGING DEVICE, METHOD FOR DRIVING RAMP SIGNAL OUTPUT CIRCUIT, METHOD FOR DRIVING ANALOG-TO-DIGITAL CONVERSION CIRCUIT, AND METHOD FOR DRIVING IMAGING DEVICE

TECHNICAL FIELD

One disclosed aspect of the embodiments relates to a ramp signal output circuit, an analog-to-digital conversion circuit, and an imaging device including an analog-to-digital conversion circuit.

BACKGROUND

Conventionally, there have been known analog-to-digital conversion circuits (hereinafter referred to as "ADCs (Analog Digital Converters)"), which convert an analog signal to a digital signal. Hereinafter, the term "AD conversion" will be used to refer to an operation for converting an analog signal to a digital signal. One known example of such ADCs is an ADC including a comparator configured to output a comparison result signal by comparing an analog signal and a ramp signal having a potential varying depending on time, a counter configured to output a count signal by counting a clock pulse signal, and a memory to which the comparison result signal and the count signal are input. In this type of ADC, the memory holds the count signal, which is a digital signal, according to the comparison result signal, whereby the analog signal is converted into a digital signal.

Japanese Patent Application Laid-Open No. 2008-187420 discusses a technique for performing an AD conversion while changing the potential of a ramp signal depending on time. FIG. 14 illustrates the configuration of a ramp signal output circuit configured to generate the ramp signal discussed in Japanese Patent Application Laid-Open No. 2008-187420. FIG. 14 accompanying the present application corresponds to FIG. 19 of Japanese Patent Application Laid-Open No. 2008-187420, although the illustrated components are relabeled in FIG. 14. The ramp signal output circuit discussed in Japanese Patent Application Laid-Open No. 2008-187420 charges and discharges an integral capacitance 51, thereby shifting the potential of the ramp signal from a potential of the auto-zero level to a predetermined potential that starts to vary depending on time.

In the ADC discussed in Japanese Patent Application Laid-Open No. 2008-187420, a current is applied to the integral capacitance 51 disposed between input and output terminals of an integrating amplifier 50 to charge and discharge the integral capacitance 51 to shift the potential of the ramp signal to the predetermined potential that starts to vary depending on time. Therefore, this ADC requires some time for charging and discharging the integral capacitance 51 to shift the potential of the ramp signal from a certain potential to the predetermined potential that starts to vary depending on time.

SUMMARY

According to an aspect of the embodiments, a ramp signal output circuit configured to output a ramp signal having a potential varying depending on time includes a voltage supply unit configured to supply a plurality of voltages having different amplitudes, a current supply unit, an integration circuit configured to output the ramp signal, and a capacitive element. The voltage supply unit is electrically connected to one terminal of the capacitive element. The integration circuit and the current supply unit are electrically connected to another terminal of the capacitive element.

According to another aspect of the embodiments, a method for driving a ramp signal output circuit that is configured to output a ramp signal having a potential varying depending on time and that includes a current supply unit, an integration circuit, and a capacitive element includes supplying a voltage to the integration circuit via the capacitive element, shifting a potential of a signal output from the integration circuit from a first potential to a potential different from the first potential by changing a voltage value to be supplied to the integration circuit via the capacitive element, supplying a current from the current supply unit to the integration circuit and the capacitive element, and outputting the ramp signal, which has the potential varying from the potential different from the first potential, from the integration circuit.

According to exemplary embodiments, it is possible to reduce a time required to shift the potential of the ramp signal to the predetermined potential that starts to vary depending on time.

Further features and aspects of the embodiments will become apparent from the following detailed description of exemplary embodiments with reference to the attached drawings.

BRIEF DESCRIPTION OF THE DRAWINGS

The accompanying drawings, which are incorporated in and constitute a part of the specification, illustrate exemplary embodiments, features, and aspects of the embodiments and, together with the description, serve to explain the principles of the embodiments.

FIG. 7A is an equivalent circuit schematic illustrating an example of a ramp signal output circuit.

FIG. 11A is a block diagram illustrating an example of an imaging device.

DESCRIPTION OF THE EMBODIMENTS

Various exemplary embodiments, features, and aspects of the embodiments will be described in detail below with reference to the drawings.

Figure 1:
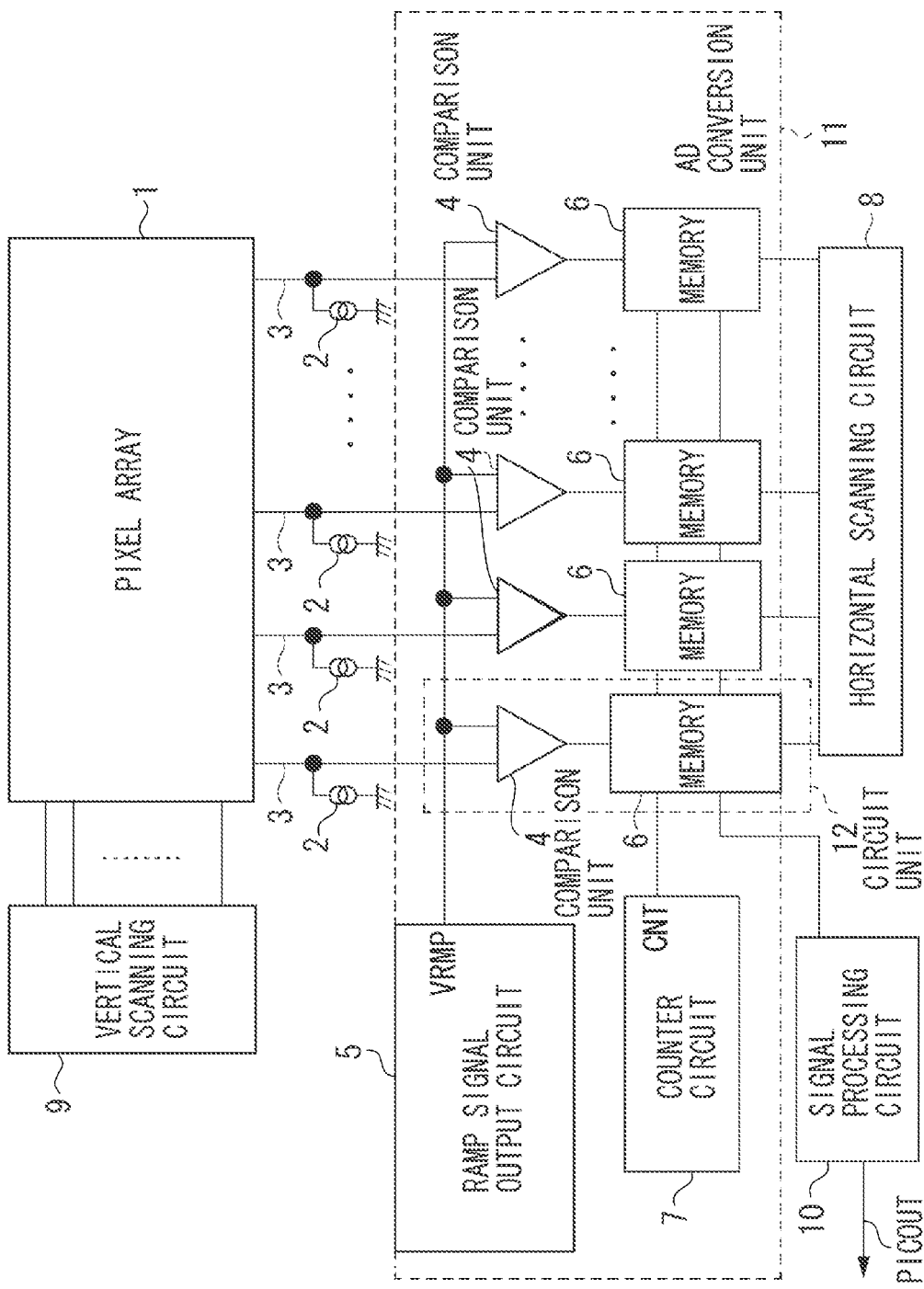
FIG. 1 is a block diagram illustrating an example of an imaging device.

FIG. 1 is a block diagram illustrating an example of the configuration of an imaging device according to a first exemplary embodiment. The imaging device according to the first exemplary embodiment includes a pixel array 1, a vertical output constant current source 2, a vertical output line 3, a comparison unit 4, a ramp signal output circuit 5, a memory 6, a counter circuit 7, a horizontal scanning circuit 8, a vertical scanning circuit 9, and a signal processing circuit 10. Further, a plurality of circuit units 12, each of which includes the comparison unit 4 and the memory 6, is arranged as columns. Further, the plurality of circuit units 12 arranged as columns, the ramp signal output circuit 5, and the counter circuit 7 constitute an AD conversion unit 11.

Figure 2:
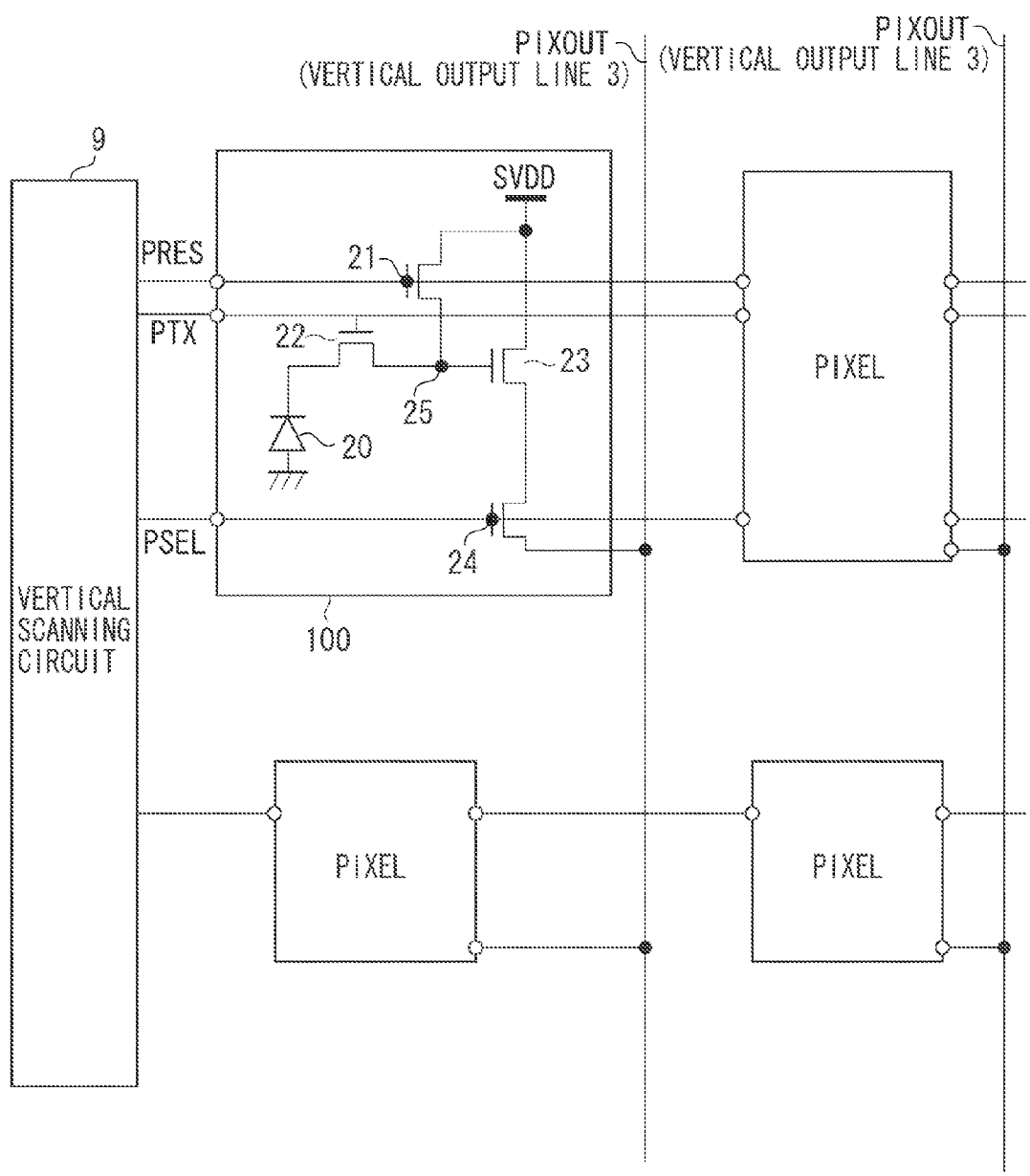
FIG. 2 is an equivalent circuit schematic illustrating an example of a pixel.

First, the pixel array 1 and the vertical scanning circuit 9 will be described with reference to FIG. 2. The pixel array 1 includes pixels 100 arranged in a plurality of rows and a plurality of columns. FIG. 2 partially illustrates the pixels 100 in two rows and two columns, which correspond to a partial area in the pixel array 1, the vertical scanning circuit 9, and the vertical output lines 3.

The specific configuration of the pixels 100 included in the pixel array 1 is illustrated as one pixel 100. The pixel 100 includes a photoelectric conversion unit 20, a reset metal-oxide semiconductor (MOS) transistor 21, a transfer MOS transistor 22, an amplification MOS transistor 23, and a selection MOS transistor 24.

The photoelectric conversion unit 20 converts incident light to an electric charge. In the present exemplary embodiment, the photoelectric conversion unit 20 is embodied by a photodiode by way of example. The transfer MOS transistor 22 transfers the electric charge of the photodiode 20 to an input node of the amplification MOS transistor 23. A transfer signal PTX is supplied from the vertical scanning circuit 9 to a control electrode of the transfer MOS transistor 22.

The amplification MOS transistor 23 amplifies a signal based on the electric charge transferred to the input node of the amplification MOS transistor 23 to output the amplified signal. A power source voltage SVDD is supplied to the amplification MOS transistor 23, and the amplification MOS transistor 23 is electrically connected to the selection MOS transistor 24. The selection MOS transistor 24 is disposed on an electric path between the amplification MOS transistor 23 and the vertical output line 3. A selection pulse PSEL is supplied from the vertical scanning circuit 9 to a control electrode of the selection MOS transistor 24. The vertical scanning circuit 9 supplies the selection pulse PSEL for each row of the pixels 100, and scans the row of the pixels 100.

The power source voltage SVDD is supplied to the reset MOS transistor 21, and the reset MOS transistor 21 is electrically connected to the input node of the amplification MOS transistor 23. In other words, the common power source voltage SVDD is supplied to each of the amplification MOS transistor 23 and the reset MOS transistor 21. Further, a reset pulse PRES is supplied from the vertical scanning circuit 9 to a control electrode of the reset MOS transistor 21. The reset MOS transistor 21 resets the potential of the input node of the amplification MOS transistor 23 based on the reset pulse PRES from the vertical scanning circuit 9. A signal output from the amplification MOS transistor 23 is output to the vertical output line 3 via the selection MOS transistor 24 as a pixel signal PIXOUT.

Referring back to FIG. 1, the imaging device according to the first exemplary embodiment will be described. The vertical output constant current source 2 is electrically connected to the vertical output line 3, and supplies a current to the vertical output line 3.

The comparison unit 4 compares the pixel signal PIXOUT input from the pixel array 1 and a signal VRMP supplied from the ramp signal output circuit 5. The signal VRMP used in this comparison is a ramp signal that is supplied from the ramp signal output circuit 5, and varies depending on time. The comparison unit 4 outputs a latch signal LATCH to the memory 6 when a change occurs in the signal value of a comparison result signal COMPOUT as a result of the comparison between the pixel signal PIXOUT and the signal VRMP.

The counter circuit 7 counts a clock pulse signal CLK supplied from a not-illustrated clock pulse supply unit since the signal VRMP from the ramp signal output circuit 5 starts to vary depending on time, and outputs a count signal CNT as a result of this counting. In other words, the counter circuit 7 counts the clock pulse signal CLK in parallel with the change in the potential of the signal VRMP, and generates and outputs the count signal CNT. The count signal CNT is commonly supplied to the memories 6 of the respective columns.

The count signal CNT is supplied from the counter circuit 7 to the memory 6. Further, the memory 6 is provided to each column corresponding to the comparison unit 4 of each column. The memory 6 holds the count signal CNT supplied from the counter circuit 7 when a change occurs in the signal value of the latch signal LATCH supplied from the comparison unit 4. Hereinafter, the term "memory holding signal" will be used to refer to the count signal CNT held by the memory 6 when a change occurs in the signal value of the latch signal LATCH.

The horizontal scanning circuit 8 scans the memory 6 of each column in order, and transfers the memory holding signal held in the memory 6 of each column to the signal processing circuit 10.

The signal processing circuit 10 performs, for example, processing for converting a gray value into a binary value on the memory holding signal transferred from the memory 6 of each column by the horizontal scanning circuit 8, and outputs an image signal PICOUT. The image signal PICOUT is an imaging signal output from the imaging device according to the first exemplary embodiment for image formation.

Figure 3A:
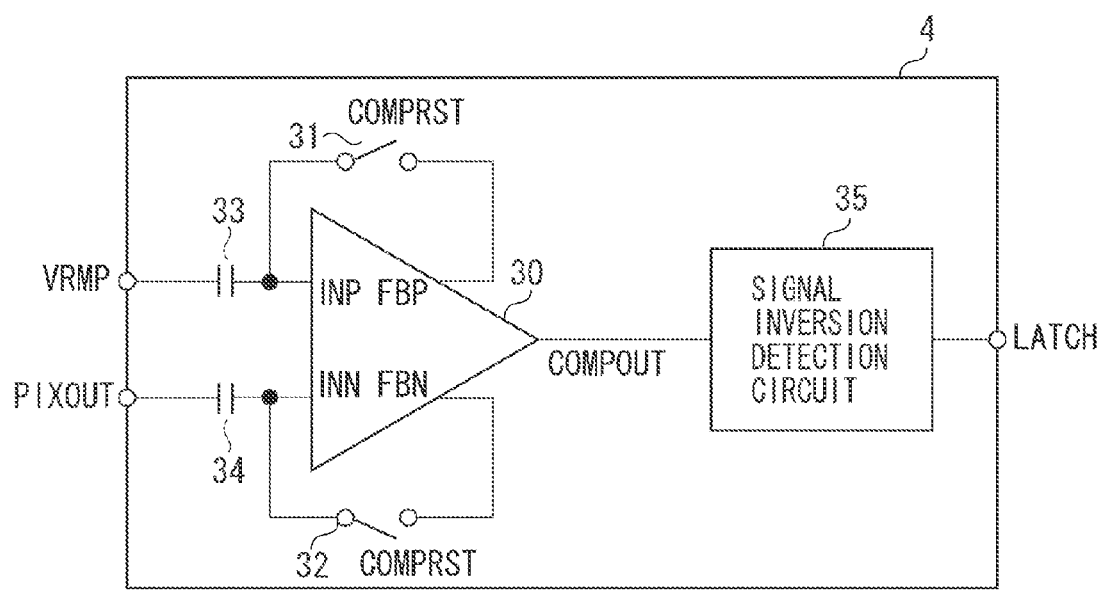
FIG. 3A is an equivalent circuit schematic illustrating an example of a comparison unit.

Next, the comparison unit 4 illustrated in FIG. 1 will be described with reference to FIGS. 3A and 3B. FIG. 3A is an equivalent circuit schematic of the comparison unit 4. The comparison unit 4 includes a differential amplifier circuit 30, comparison unit reset switches 31 and 32, comparison unit input capacities 33 and 34, and a signal inversion detection circuit 35.

The signal VRMP is input into an input terminal INP of the differential amplifier circuit 30 via the comparison unit input capacitance 33. The term "potential V-INP" will be used to refer to a potential input into the input terminal INP based on the signal VRMP. The pixel signal PIXOUT is input into an input terminal INN of the differential amplifier circuit 30 via the comparison unit input capacitance 34. The term "potential V-INN" will be used to refer to a potential input into the input terminal INN based on the pixel signal PIXOUT.

The comparison unit reset switch 31 switches conduction and non-conduction of a feedback path from a feedback terminal FBP to the input terminal INP by a comparison unit reset pulse COMPRST. The comparison unit reset switch 32 switches conduction and non-conduction of a feedback path from a feedback terminal FBN to the input terminal INN by the same comparison unit reset pulse COMPRST. When the comparison unit reset pulse COMPRST is set to a high level (hereinafter referred to as "H level"; similarly, a low level will be referred to as "L level"), the feedback path from the feedback terminal FBP to the input terminal INP and the feedback path from the feedback terminal FBN to the input terminal INN each are brought into a conduction state.

The differential amplifier circuit 30 outputs the comparison result signal COMPOUT to the signal inversion detection circuit 35. When a change occurs in the signal value of the comparison result signal COMPOUT, a change also occurs in the signal value of the latch signal LATCH output from the signal inversion detection circuit 35.

Figure 3B:
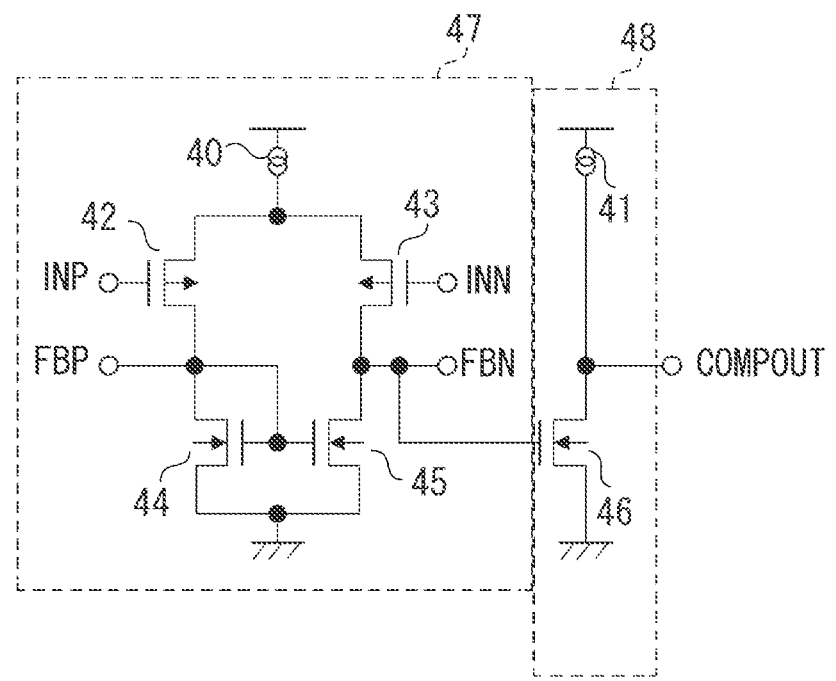
FIG. 3B is an equivalent circuit schematic illustrating the example of the comparison unit.

FIG. 3B is an equivalent circuit schematic of the differential amplifier circuit 30. The differential amplifier circuit 30 includes two-stage amplifiers, i.e., a differential amplification unit 47, which includes a constant current source 40, differential input stage P-channel metal oxide semiconductor (PMOS) transistors 42 and 43, and load N-channel metal oxide semiconductor (NMOS) transistors 44 and 45, and a common source stage 48, which includes a constant current source 41 and a common source NMOS transistor 46.

When the potential V-INP based on the signal VRMP input to the input terminal INP is lower than the potential V-INN based on the pixel signal PIXOUT input to the input terminal INN, the common source NMOS transistor 46 is turned on, and the comparison result signal COMPOUT is maintained at the L level. When the potential V-INP becomes larger than the potential V-INN, the common source NMOS transistor 46 is turned off, and the comparison result signal COMPOUT is set to the H level. When the comparison result signal COMPOUT is changed from the L level to the H level, the latch signal LATCH is output to the memory 6.

Figure 4A:
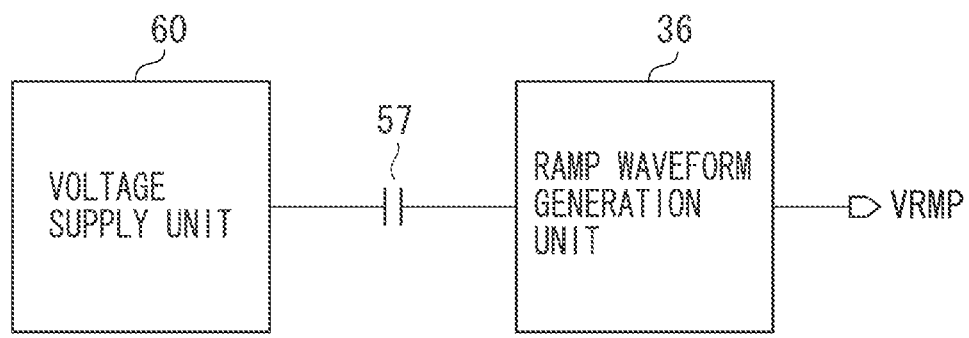
FIG. 4A is a block diagram illustrating an example of a ramp signal output circuit.

FIG. 4A schematically illustrates the ramp signal output circuit 5 according to the first exemplary embodiment. The ramp signal output circuit 5 includes at least a voltage supply unit 60, an input capacitive element 57, and a ramp waveform generation unit 36. The signal VRMP output from the ramp wave generation unit 36 corresponds to a ramp signal. The voltage supply unit 60 outputs at least two voltages VDAC_REF and VDAC_STN having different amplitudes to the ramp waveform generation unit 36 via the input capacitive element 57. A ramp start potential, from which the potential of the signal VRMP starts to vary depending on time, is determined based on the voltage output from the voltage supply unit 60. The ramp waveform generation unit 36 generates a ramp signal having a ramp waveform varying from the ramp start potential depending on time.

Figure 4B:
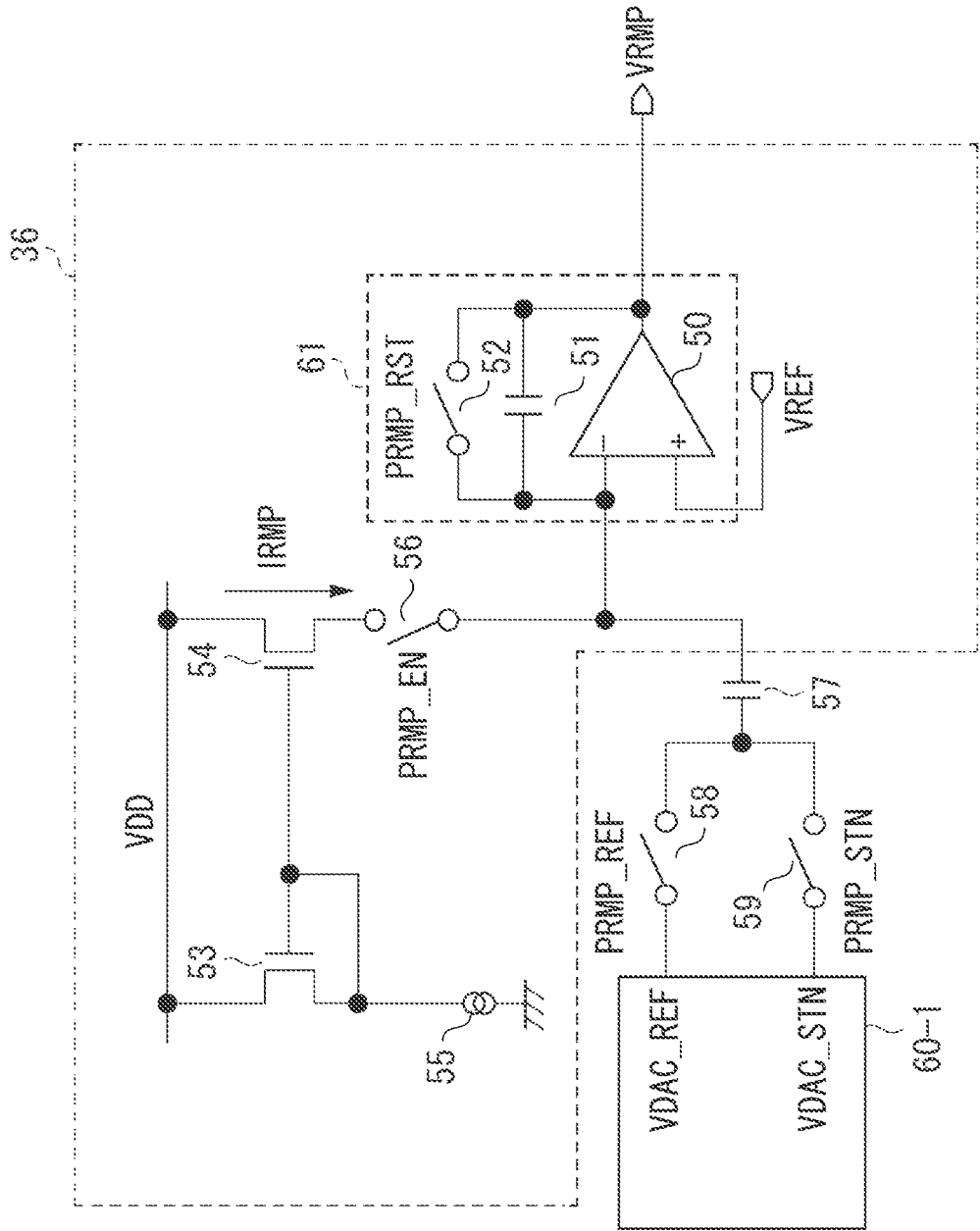
FIG. 4B is an equivalent circuit schematic illustrating the example of the ramp signal output circuit.

Next, an example of the ramp signal output circuit 5 illustrated in FIG. 4A will be described with reference to FIG. 4B. FIG. 4B illustrates an example of the circuit configuration of the ramp signal output circuit 5. At a differential amplification circuit 50, an amplification reference signal VREF is supplied to a non-inverting terminal. An integral capacitance 51 and an integral amplification reset switch 52 are electrically connected between an inverting terminal and an output terminal. The inverting terminal corresponds to a first input terminal of the differential amplification circuit 50, and the non-inverting terminal corresponds to a second input terminal of the differential amplification circuit 50. The amplification reference signal VREF is a reference voltage for acquiring a difference from a signal input into the inverting terminal. The differential amplification circuit 50 is a differential amplification unit included in the ramp signal output circuit 5. The differential amplification circuit 50, the integral capacitance 51, and the integral amplification reset switch 52 constitutes a capacitance feedback amplification circuit 61.

A constant current IRMP supplied from current mirror PMOS transistors 53 and 54 is supplied to the inverting terminal via a ramp current supply switch 56. The ramp current supply switch 56 is turned on when a control pulse PRMP_EN is set to the H level, and is turned off when the control pulse PRMP_EN is set to the L level. A reference current is supplied from a constant current source 55 to the current mirror PMOS transistor 53. A current supply unit in the first exemplary embodiment includes the current mirror PMOS transistors 53 and 54, the constant current source 55, and the ramp current supply switch 56.

Further, the input capacitive element 57 is electrically connected to the inverting terminal. A voltage supply unit 60-1 is electrically connected to the other terminal of the input capacitive element 57 via offset changeover switches 58 and 59. The offset changeover switch 58 is turned on when a control pulse PRMP_REF is set to the H level, and is turned off when the control pulse PRMP_REF is set to the L level. The offset changeover switch 59 is turned on when a control pulse PRMP_STN is set to the H level, and is turned off when the control pulse PRMP_STN is set to the L level.

The voltage supply unit 60-1 supplies signals having different voltage values to the respective offset changeover switches 58 and 59. More specifically, the voltage supply unit 60-1 supplies the voltage VDAC_REF to the offset changeover switch 58. On the other hand, the voltage supply unit 60-1 supplies the voltage VDAC_STN to the offset changeover switch 59. It is possible to shift the potential of the signal VRMP from a certain potential to the ramp start potential, which is a potential before the potential starts to vary depending on time, by turning on and off each of the offset changeover switches 58 and 59. The operation for shifting the potential of the signal VRMP to the ramp start potential will be described in detail below with reference to FIG. 5.

Figure 5:
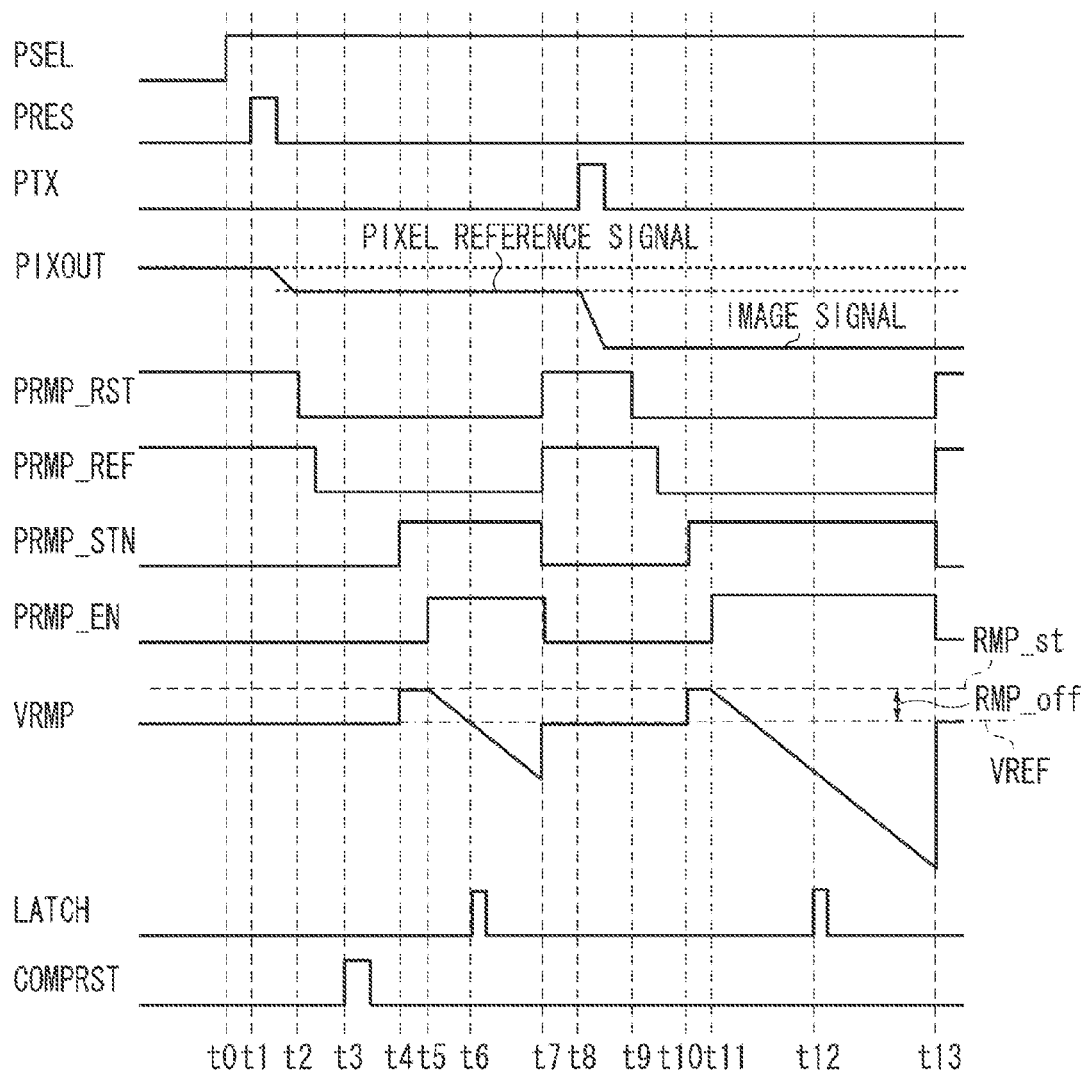
FIG. 5 is an operation timing diagram illustrating an example of an operation of the imaging device.

FIG. 5 is an operation timing diagram illustrating an example of the operation of the imaging device according to the first exemplary embodiment. The operation timing diagram of FIG. 5 illustrates an operation when the pixel 100 of one row outputs the pixel signal PIXOUT, and an operation of the AD conversion unit 11.

At time t0, the selection pulse PSEL is set to the H level, thereby selecting the row of the pixel 100 from which the pixel signal PIXOUT is output. Further, at time t0, the control pulse PRMP_RST is maintained at the H level. The integral capacitance 51 of the ramp signal output circuit 5 is reset by setting the control pulse PRMP_RST to the H level to turn on the integral amplification reset switch 52. At this time, the differential amplification circuit 50 is in a state buffering the amplification reference signal VREF input to the non-inverting terminal. At time t0, the potential of the signal VRMP output from the differential amplification circuit 50 is equal to the potential of the amplification reference signal VREF. The potential of the signal VRMP at time t0 corresponds to a first potential of the signal VRMP. Further, at time t0, the control pulse PRMP_REF is maintained at the H level, and the control PRMP_STN is maintained at the L level. At this time, the voltage VDAC_REF is supplied from the voltage supply unit 60-1 to the input capacitive element 57 via the offset changeover switch 58.

At time t1, the reset pulse PRES is set to the H level, thereby resetting the potential of the input node of the amplification MOS transistor 23. After that, the reset pulse PRES is set to the L level. The term "pixel reference signal" will be used to refer to the pixel signal PIXOUT output when the reset pulse PRES is set to the L level in this way. The pixel reference signal is a signal including a noise component of the pixel 100.

At time t2, after the control pulse PRMP_RST is set to the L level, the control pulse PRMP_REF is set to the L level. The electric charge when the control pulse PRMP_RST is set to the L level is held in the integral capacitance 51. Further, the electric charge when the control pulse PRMP_REF is set to the L level is held in the input capacitive element 57.

At time t3, the comparison unit reset pulse COMPRST is set to the H level, and then is set to the L level. As a result, the potential of the signal VRMP when the comparison unit reset pulse COMPRST is set to the L level, i.e., the potential of the amplification reference signal VREF is held in the comparison unit input capacitance 33. Therefore, during the operation after that, the signal of the difference between the signal VRMP and the amplification reference signal VREF will be input in the input terminal INP of the differential amplification circuit 30 until the comparison unit reset pulse COMPRST is set to the H level next time. On the other hand, the electric charge based on the potential of the pixel reference signal of the pixel signal PIXOUT when the comparison unit reset pulse COMPRST is set to the L level is held in the comparison unit input capacitance 34. Therefore, during the operation after that, the signal of the difference between the pixel reference signal and the pixel signal PIXOUT will be input in the input terminal INN of the differential amplification circuit 30 until the comparison unit reset pulse COMPRST is set to the H level next time.

At time t4, the control pulse PRMP_STN is set to the H level. A voltage Voff, which is the voltage difference between the voltage VDAC_STN and the voltage VDAC_REF, is supplied to the inverting terminal of the differential amplification circuit 50. The voltage Voff is amplified by the differential amplification circuit 50 by an amount corresponding to the capacitance gain of the integral capacitance 51 and the input capacitive element 57, and then is output from the differential amplification circuit 50. The difference between the signal output from the differential amplification circuit 50 at this time and the amplification reference signal VREF is an offset amount RMP_off of the ramp start potential RMP_st, which is a potential before the potential of the signal VRMP starts to vary, from the amplification reference signal VREF. In this way, the potential of the ramp start potential RMP_st is determined. The ramp start potential RMP_st corresponds to a second potential of the signal VRMP.

At time t5, the control pulse PRMP_EN is set to the H level, thereby turning on the ramp current supply switch 56. As a result, the signal VRMP starts to show a ramp waveform having an inclination determined by the capacitance value of the integral capacitance 51 and the current value of a ramp current IRMP. In other words, the signal VRMP at this time is a ramp signal having a potential varying depending on time. The inclination of the signal VRMP is a change amount of the potential of the signal VRMP per unit time. Further, at the same time that the control pulse PRMP_EN is set to the H level, the counter circuit 7 starts to count the clock pulse signal.

At time t6, the signal value of the latch signal LATCH is changed. The memory 6 holds the signal value of the count signal CNT at this time. The term "N signal" will be used to refer to the signal value of the count signal CNT held by the memory 6 at this time. The N signal is a signal including a noise component of the comparison unit 4 such as an offset of the comparison unit 4 of each column.

At time t7, the control pulse PRMP_EN is set to the L level, thereby stopping the change in the potential of the signal VRMP depending on time. Further, at time t7, the control pulse PRMP_STN is set to the L level, and the control pulse PRMP_REF is set to the H level. Further, the control pulse PRMP_RST is set to the H level, thereby resetting the electric charges of the integral capacitance 51 and the input capacitive element 57 to the states at time t0. The counter circuit 7 stops counting the clock pulse signal, and returns the count signal CNT to the initial value thereof.

At time t8, the transfer pulse PTX is set to the H level. As a result, the signal electric charge that the photodiode 20 generates by photoelectrically converting incident light is transferred to the input node of the amplification MOS transistor 23. The amplification MOS transistor 23 outputs a signal based on the potential of the input node of the amplification MOS transistor 23 to which the signal electric charge generated by the photodiode 20 is transferred. This signal is output to the vertical output line 3 via the selection MOS transistor 24. This signal is an image signal, which is one pixel signal PIXOUT.

The electric charge when the comparison unit reset pulse COMPRST is set to the H level at time t3 and is then set to the L level is held in the comparison unit input capacitance 34. In other words, the potential of the pixel reference signal, which is one pixel signal PIXOUT, is held in the comparison unit input capacitance 34. Therefore, the signal of the difference between the image signal and the pixel reference signal is input into the input terminal INN of the differential amplification circuit 30. The noise component of the pixel 100 is included in the pixel reference signal, as described above. Therefore, the signal resulting from a subtraction of the noise component from the image signal is input from the comparison unit input capacitance 34 to the differential amplification circuit 30.

At time t9, the control pulse PRMP_RST is set to the L level in a similar manner to the operation at time t2. Then, the control pulse PRMP_REF is set to the L level.

At time 10, the control pulse PRMP_STN is set to the H level in a similar manner to the operation at time t4. The signal VRMP is changed from the amplification reference signal VREF by the offset amount RMP_off, thereby having the ramp start potential RMP_st.

At time t11, the control pulse PRMP_EN is set to the H level in a similar manner to the operation at time t5, as a result of which the potential of the signal VRMP starts to vary depending on time. The counter circuit 7 starts to count the clock pulse signal.

Suppose that the magnitude relationship is reversed at time t12 between the signal input into the input terminal INN of the differential amplification circuit 30 and the signal input into the input terminal INP. In this case, a change occurs in the signal value of the latch signal LATCH output from the comparison unit 4. Upon this change in the signal value of the latch signal LATCH, the memory 6 holds the signal value of the count signal CNT at time t12. The term "S signal" will be used to refer to the count signal CNT held by the memory 6 at this time.

At time t13, the control pulse PRMP_EN is set to the L level in a similar manner to the operation at time t7, as a result of which the potential of the signal VRMP stops varying depending on time. Further, at time t13, the control pulse PRMP_STN is set to the L level, and the control pulse PRMP_REF is set to the H level. Further, the control pulse PRMP_RST is set to the H level, thereby resetting the electric charges of the integral capacitance 51 and the input capacitive element 57 to the states at time t0. The counter circuit 7 stops counting the clock pulse signal, and returns the count signal CNT to the initial value thereof.

In the first exemplary embodiment, a first comparison, which is a comparison between the signal VRMP and the analog signal, corresponds to the operation performed during the period between time t11 and time t13. Further, a second comparison, which is a comparison between the signal VRMP and the pixel reference signal, corresponds to the operation performed during the period between time t5 to time t7.

The N signal and S signal held in the memory 6 of each column are transferred to the signal processing circuit 10 in order by the horizontal scanning circuit 8. The signal processing circuit 10 performs, for example, processing for acquiring a difference between the S signal and the N signal. The noise component of the comparison unit 4, such as the offset of the comparison unit 4 of each column, can be subtracted from the S signal by the subtraction of the N signal from the S signal. Therefore, it is possible to reduce the influence of a variation in the characteristics of the comparison units 4 of the respective columns to the S signal. The signal processing circuit 10 outputs the signal resulting from the subtraction of the N signal from the S signal as the image signal PICOUT.

The ramp signal output circuit 5 according to the first exemplary embodiment includes the voltage supply unit 60-1, which supplies the plurality of voltages, and the input capacitive element 57. It is possible to shift the potential of the signal VRMP from the potential of the amplification reference voltage VREF by applying the voltage VDAC_STN to the differential amplification circuit 50 after storing the potential of the voltage VDAC_REF in the input capacitive element 57. Therefore, the ramp signal output circuit 5 according to the first exemplary embodiment has such a beneficial effect that it can shift the potential of the signal VRMP at a high speed, compared to the configuration that shifts the potential of the signal VRMP by charging and discharging the integral capacitance 51 by applying a current to the integral capacitance 51.

Further, in the configuration that shifts the potential of the signal VRMP by charging and discharging the integral capacitance 51 by applying a current to the integral capacitance 51, a change in the current value of the current applied to the integral capacitance 51 affects the offset amount of the signal VRMP. In other words, even if a current having the same current value is applied to the integral capacitance 51, the offset amount of the signal VRMP is changed depending on how the current value is changed. Therefore, this conventional configuration has such an issue that the accuracy of AD conversion is deteriorated since the value of the ramp start potential RMP_st is changed.

The ramp signal output circuit 5 according to the first exemplary embodiment can shift the signal VRMP without relying on charging and discharging the integral capacitance 51. Therefore, it is possible to prevent a change in the value of the ramp start potential RMP_st. Therefore, it is possible to improve the accuracy of AD conversion, compared to the configuration that shifts the signal VRMP by charging and discharging the integral capacitance 51 by applying a current to the integral capacitance 51.

The first exemplary embodiment has been described based on an example in which the ramp waveform generation unit 36 includes the capacitance feedback amplification circuit 61 having the differential amplification circuit 50 and the integral capacitance 51 by way of example. However, the first exemplary embodiment is not limited to this configuration including the capacitance feedback amplification circuit 61, and can be effectively carried out with any configuration including an integration circuit. Further, the first exemplary embodiment can be effectively carried out even with a configuration without an integration circuit, such as a configuration in which the ramp waveform generation unit 36 is constituted by a source follower circuit. Even this configuration can generate the ramp signal VRMP having a ramp waveform, and can determine the ramp start potential due to the existence of the voltage supply unit 60 and the input capacitive element 57.

Figure 4C:
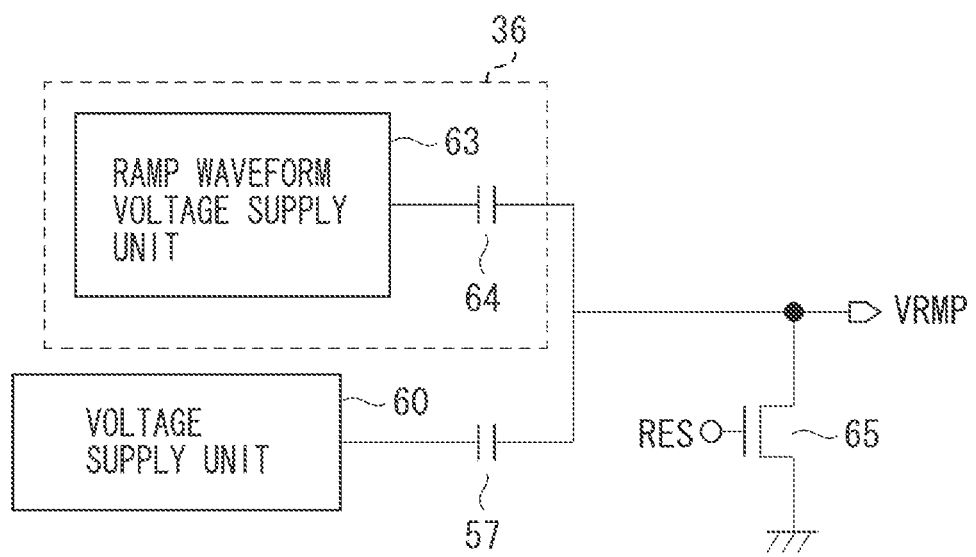
FIG. 4C is a block diagram illustrating an example of the ramp signal output circuit.

Further, as illustrated in FIG. 4C, the ramp waveform generation unit 36 may include a ramp waveform voltage supply unit 63 and a capacitance 64. When the reset pulse RES is supplied to a control electrode of a transistor 65, the transistor 65 resets the electric charges of the capacitance 64 and the input capacitive element 57. The ramp waveform voltage supply unit 63 can, for example, include a resistance array having a variable resistance value, and can be configured to output a voltage based on the resistance value.

The first exemplary embodiment has been described employing an imaging device as an example of the device including the AD conversion unit 11. However, the first exemplary embodiment is not limited to this configuration. The first exemplary embodiment can be applied to a ramp signal output circuit of an ADC configured to convert an analog signal to a digital signal based on a result of a comparison between the analog signal and a ramp signal having a potential varying depending on time.

Further, the first exemplary embodiment has been described based on an example in which the imaging device includes the signal processing circuit 10. However, the imaging device does not have to include the signal processing circuit 10. The signal processing circuit 10 may be provided to another device than the imaging device, and a signal may be output from the imaging device to the signal processing circuit 10.

Figure 6:
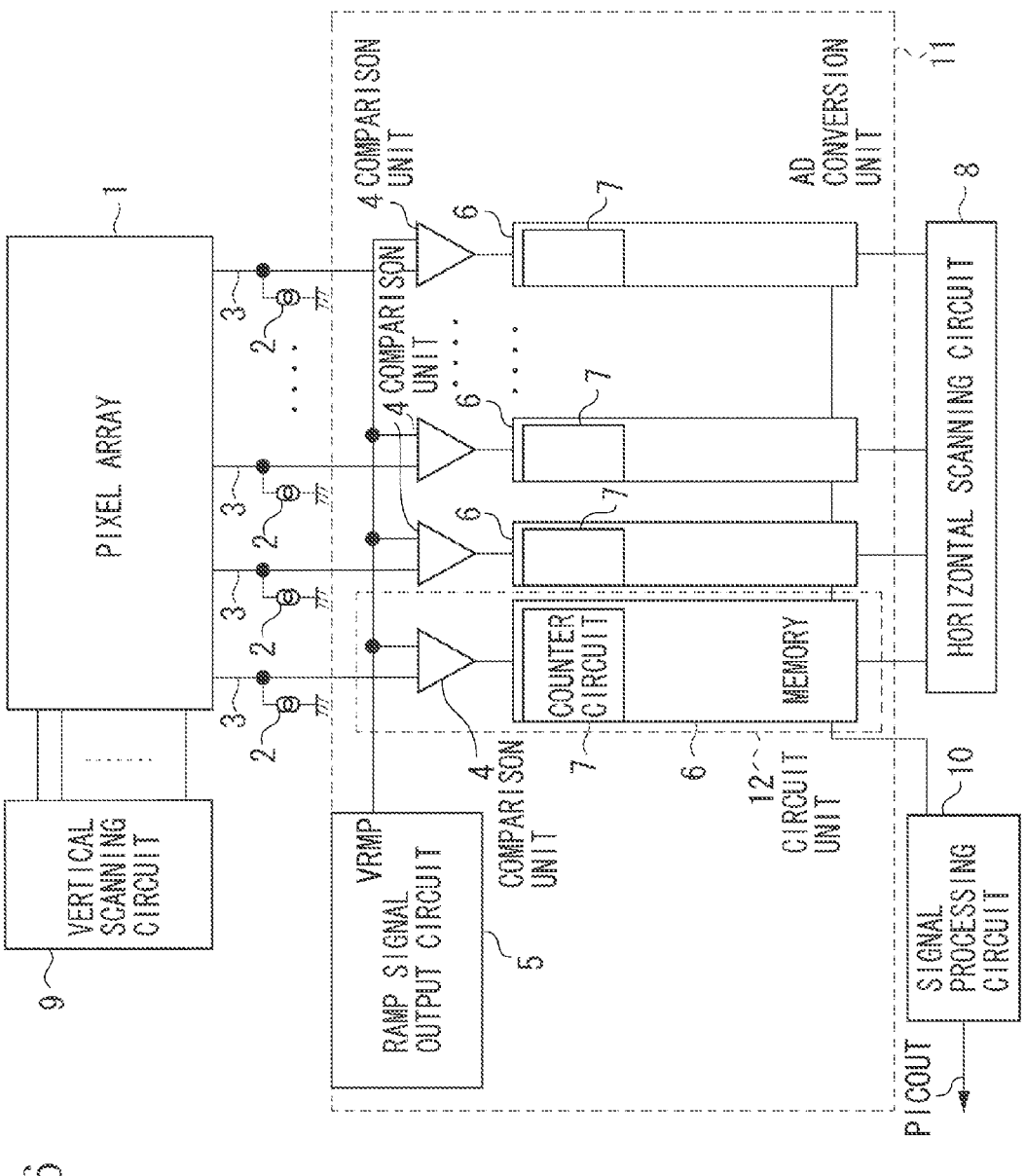
FIG. 6 is a block diagram illustrating another configuration of the imaging device.

Further, the first exemplary embodiment has been described based on an example in which the counter circuit 7 outputs the count signal CNT in common to the memories 6 of the respective columns. However, as another example, as illustrated in FIG. 6, the memories 6 of the respective columns may include the counter circuits 7 that each generate the count signal CNT. In this case, the latch signal LATCH is output from the comparison units 4 of the respective columns to the counter circuits 7 of the respective columns. The memories 6 each hold the count signal CNT when a change occurs in the signal value of the latch signal LATCH. The ramp signal output circuit 5 configured in a manner described in the description of the first exemplary embodiment can be effectively applied to even this example.

Further, the first exemplary embodiment has been described based on an example in which the potential of the signal VRMP is shifted from the amplification reference signal VREF to the ramp start potential RMP_st. However, the potential of the signal VRMP may be shifted from another potential than the amplification reference signal VREF to the ramp start potential RMP_st.

A second exemplary embodiment will be described with reference to the drawings, focusing on differences from the first exemplary embodiment. FIG. 7A is an equivalent circuit schematic of the ramp signal output circuit 5 according to the second exemplary embodiment. In FIG. 7A, components that function in similar manners to the components illustrated in FIG. 4B are indicated by the same reference numerals as those in FIG. 4B.

A variable current source 72 can supply a current while varying the current value thereof. A transistor 71 is a current mirror PMOS transistor. A voltage supply unit 60-2 is an example of the voltage supply unit 60 in the second exemplary embodiment. The current mirror PMOS transistor 54 is a first transistor that supplies a current from the current source to the differential amplification circuit 50. Further, the current mirror PMOS transistor 71 supplies a current IDAC to the voltage supply unit 60-2 based on a current supplied from the current mirror PMOS transistor 53 and the variable current source 72. In other words, the current mirror PMOS transistor 71 is a second transistor that supplies a current from the current source to the voltage supply unit 60-2.

In the second exemplary embodiment, a current is commonly supplied to the control electrodes of the current mirror PMOS transistors 54 and 71 from the current mirror PMOS transistor 53 and the variable current source 72. Therefore, the current value of the current IDAC supplied to the voltage supply unit 60-2 and the current value of the current IRMP supplied to the differential amplification circuit 50 are in a proportional relationship. The current supply unit in the second exemplary embodiment includes the current mirror PMOS transistors 53, 54, 71, the variable current source 72, and the ramp current supply switch 56.

Figure 7B:
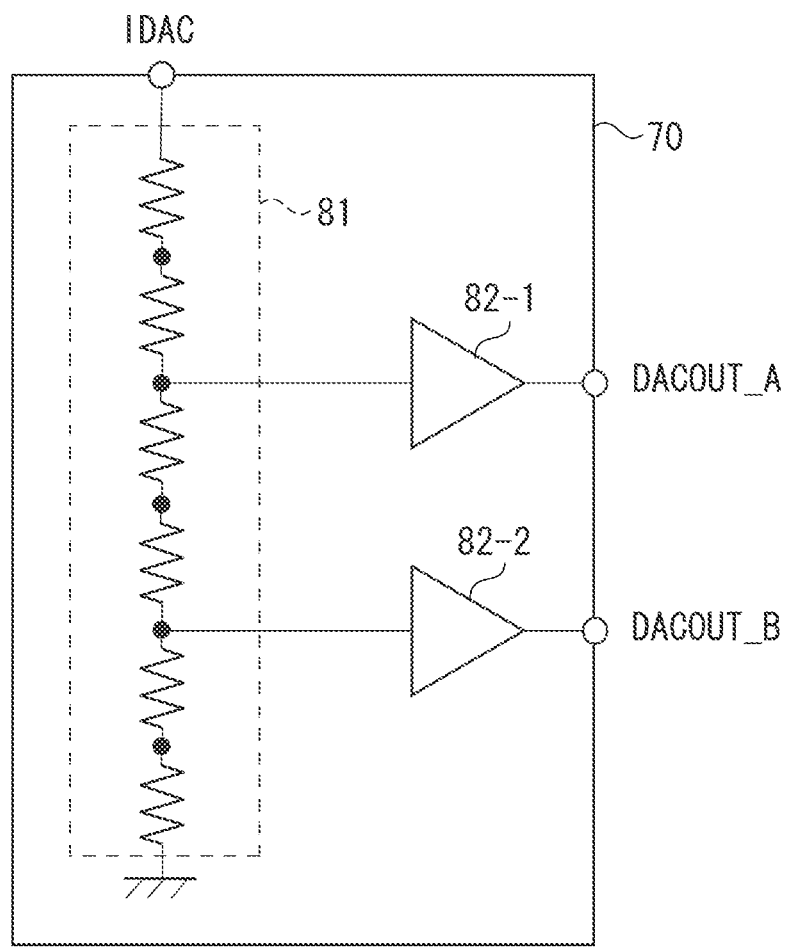
FIG. 7B is an equivalent circuit schematic illustrating an example of a voltage supply unit.

FIG. 7B illustrates the detailed configuration of the voltage supply unit 60-2 in the second exemplary embodiment. A resistance array 81 includes a plurality of resistances. A plurality of buffers 82-1 and 82-2 are electrically connected to the resistance array 81. Further, the current mirror PMOS transistor 71 supplies the current IDAC to the resistance array 81. The resistance array 81 converts the current IDAC to a voltage, and outputs the converted voltage to the plurality of buffers 82-1 and 82-2.

The buffer 82-1 outputs a voltage DACOUT_A, and the buffer 82-2 outputs a voltage DACOUT_B. The resistance value of the electric path from the current mirror PMOS transistor 71 to the buffer 82-1 is different from the resistance value of the electric path from the current mirror PMOS transistor 71 to the buffer 82-2. Therefore, the voltage value supplied to the buffer 82-1 is different from the voltage value supplied to the buffer 82-2. Accordingly, the voltage DACOUT_A output from the buffer 82-1 and the DACOUT_B output from the buffer 82-2 have different voltage values. In this way, the voltage supply unit 60-2 can output a plurality of voltage values. How to assign the voltages DACOUT_A and DACOUT_B to the voltage VDAC_REF and VDAC_STN can be determined based on whether to set the shift direction of the signal VRMP the same as or differently from the direction in which the signal VRMP varies during an AD conversion.

Figure 8:
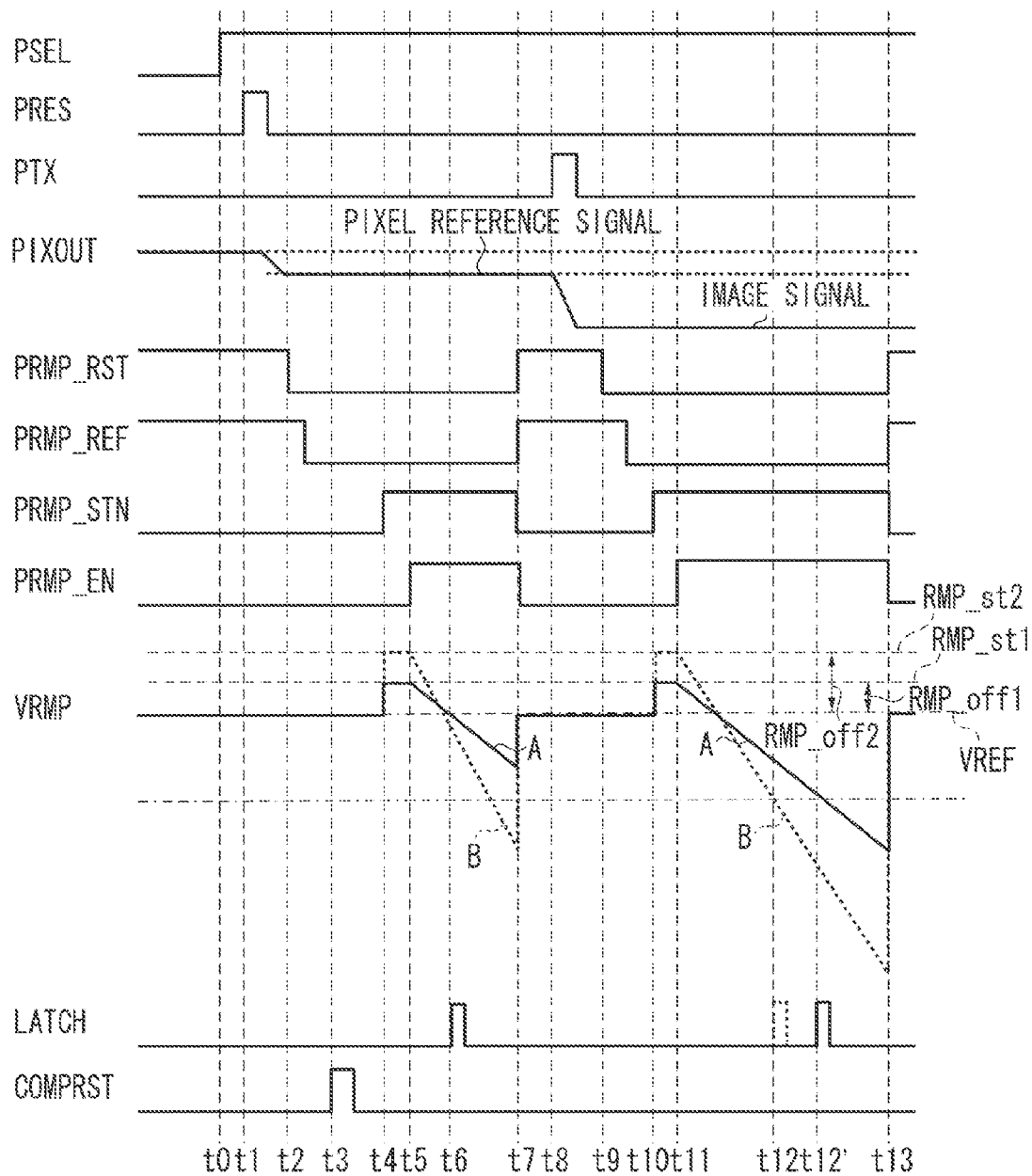
FIG. 8 is an operation timing diagram illustrating another example of the operation of the imaging device.

FIG. 8 is an operation timing diagram illustrating an example of the operation of the imaging device illustrated in FIG. 1 using the ramp signal output circuit 5 according to the second exemplary embodiment. The imaging device including the ramp signal output circuit 5 according to the second exemplary embodiment can function in a similar manner to the operation timing described in the description of the first exemplary embodiment with reference to FIG. 5.

In the ramp signal output circuit 5 according to the second exemplary embodiment, the current value of the current IDAC supplied to the voltage supply unit 60-2 and the current value of the current IRMP supplied to the differential amplification circuit 50 are in a proportional relationship as described above. Suppose that the current value of the current IRMP is I ampere. The ramp waveform of the signal VRMP at this time is the inclination A illustrated in FIG. 8. Further, when the current value of the current IRMP is I ampere, the difference between the ramp start potential RMP_st and the amplification reference signal VREF is an offset amount RMP_off1. Suppose that I' ampere is the current value of the current IDAC when the current value of the current IRMP is I ampere. Then, suppose that the current value of the current IRMP is changed to 2I ampere, which is a double of I ampere, keeping the resistance of the voltage supply unit 60-2 the same as the resistance at the time of generation of the signal VRMP having the ramp waveform A. Since the current IDAC is in a proportional relationship with the current IRMP, the current value of the current IDAC is also doubled into 2I' ampere. Therefore, the difference between the potentials of the voltage VDAC_REF and the voltage VDAC_STN output from the voltage supply unit 60-2 is doubled compared to the difference at the time of generation of the signal VRMP having the above-described ramp waveform A. Accordingly, an offset amount RMP_off2, which is the difference between the ramp start potential RMP_st of the signal VRMP and the potential of the amplification reference signal VREF, is doubled compared to the offset amount RMP_off1. Further, since the current value of the current IRMP is 2I ampere, the inclination of the signal VRMP output from the differential amplification circuit 50 is doubled compared to the signal VRMP having the above-described ramp waveform A. FIG. 8 illustrates the ramp waveform of the signal VRMP generated when the current value of the current IRMP is doubled into 2I ampere, as the inclination B.

In the ramp signal output circuit 5 according to the second exemplary embodiment, the current IRMP and the current IDAC are in a proportional relationship. The ramp signal output circuit 5 according to the second exemplary embodiment has beneficial effects described above in the description of the first exemplary embodiment. Further, the ramp signal output circuit 5 according to the second exemplary embodiment allows interlocked settings of the offset amount RMP_off, which is the difference between the ramp start potential RMP_st and the amplification reference signal VREF, and the inclination of the signal VRMP during an AD conversion.

Further, changing the inclination of the signal VRMP can change the gain of the signal output from the AD conversion unit 11 relative to the pixel output signal PIXOUT, and this mechanism will be described now. In a case where the signal VRMP varies according to the ramp waveform B, suppose that the signal value of the latch signal LATCH is changed at time t12. In a case where the signal VRMP varies according to the ramp waveform A, provided that the same electronic potential is supplied to the input terminal INN of the differential amplification circuit 30, the signal value of the latch signal LATCH is changed at time t12' later than time t12. Therefore, the S signal held in the memory 6 when the signal VRMP varies according to the ramp waveform A is larger than the S signal when the signal VRMP varies according to the ramp waveform B. In this way, the signal value of the signal held in the memory 6 can be changed by the inclination of the variation of the signal VRMP. As a result, it is possible to change the gain of the signal output from the AD conversion unit 11 relative to the pixel output signal PIXOUT.

The ramp signal output circuit 5 according to the second exemplary embodiment is configured in such a manner that the voltage supply unit 60-2 generates a plurality of voltages with use of the same resistance value for generation of the respective signals VRMP having the ramp waveform A and the ramp waveform B, respectively. However, the voltage supply unit 60-2 may use a different resistance value for generation of the signal VRMP having a different ramp waveform from the ramp waveform A. In this case, the offset amount RMP_off can be set independently of the inclination of the signal VRMP.

Figure 9:
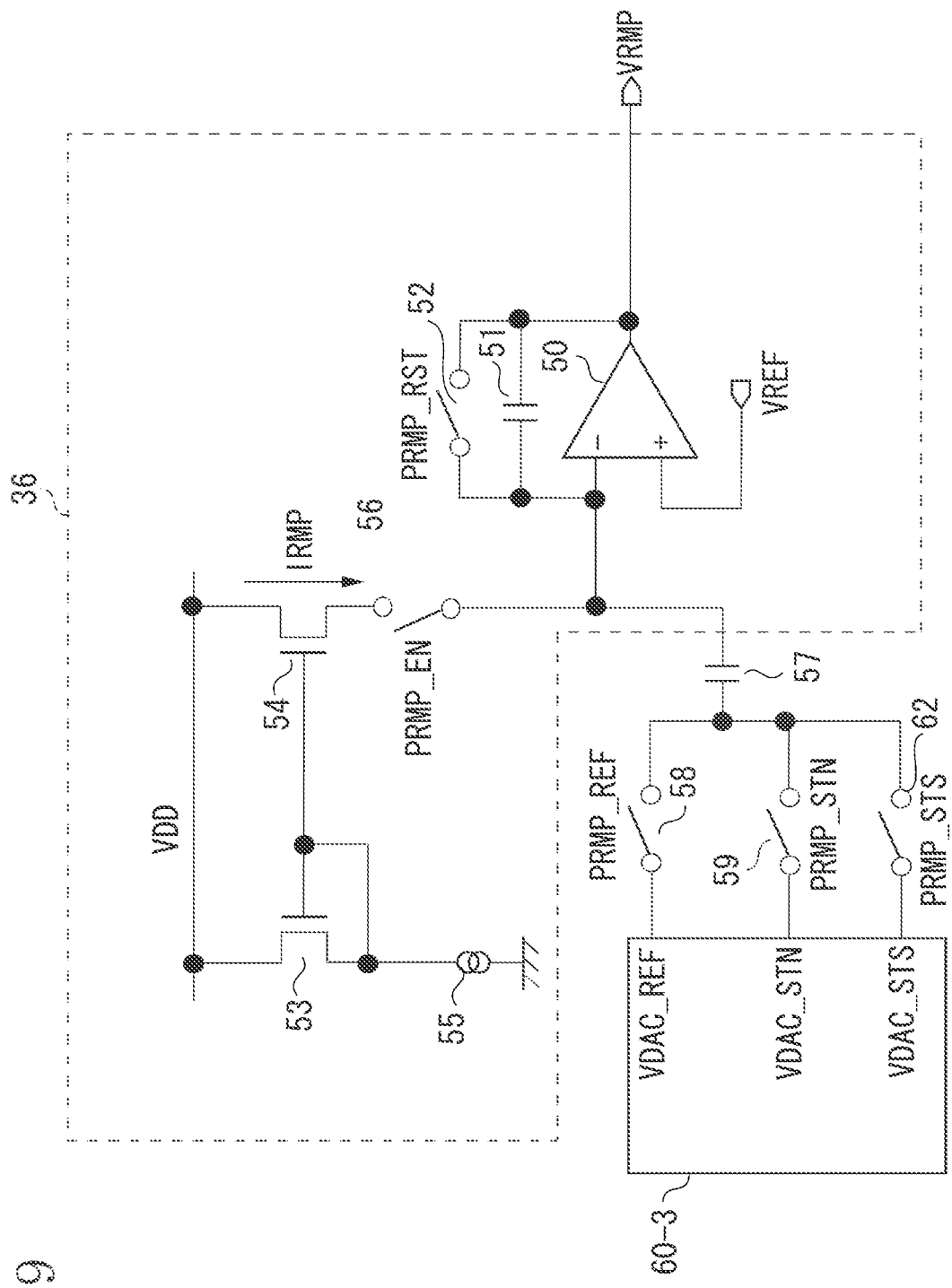
FIG. 9 is an equivalent circuit schematic illustrating an example of a ramp signal output circuit.

A third exemplary embodiment will be described with reference to the drawings, focusing on differences from the first exemplary embodiment. FIG. 9 is an equivalent circuit schematic of the ramp signal output circuit 5 according to the third exemplary embodiment. In FIG. 9, components that function in similar manners to the components illustrated in FIG. 4B are indicated by the same reference numerals as those in FIG. 4B.

A voltage supply unit 60-3 according to the third exemplary embodiment outputs three voltages, VDAC_REF, VDAC_STN, and VDAC_STS. Therefore, the voltage supply unit 60-3 further includes a terminal for outputting the voltage VDAC_STS, in addition to the configuration described in the description of the first exemplary embodiment. Further, the magnitude relationship among the three voltage values satisfies the relational expression (VDAC_STS>VDAC_REF>VDAC_STN). Further, an offset changeover switch 62 is disposed on the electric path between the terminal for outputting the voltage VDAC_STS and the input capacitive element 57. The offset changeover switch 62 is turned on when a control pulse PRMP_STS is set to the H lever, and is turned off when the control pulse PRMP_STS is set to the L level.

Figure 10:
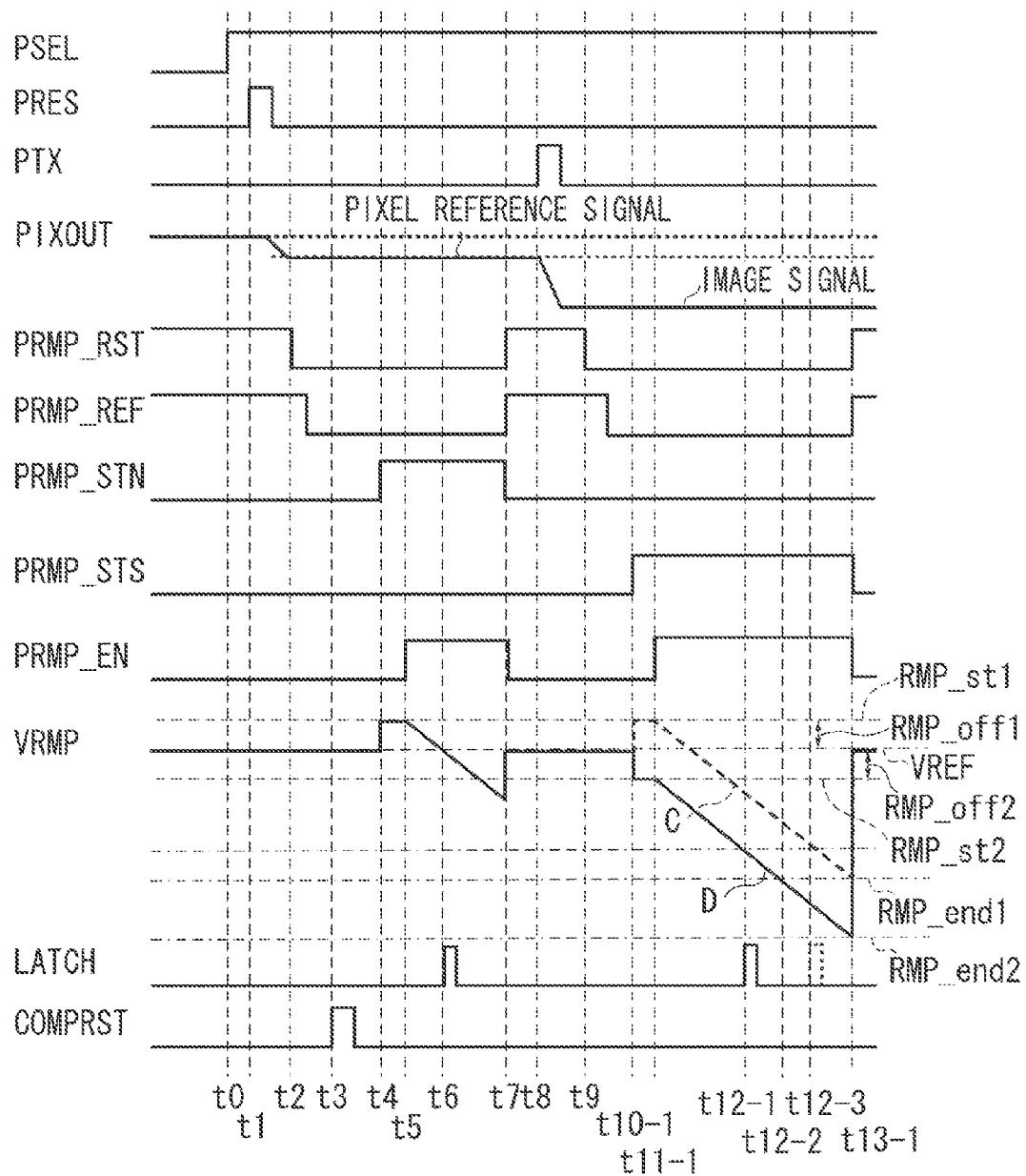
FIG. 10 is an operation timing diagram illustrating another example of the operation of the imaging device.

FIG. 10 is an operation timing diagram illustrating an example of the operation of the imaging device illustrated in FIG. 1 including the ramp signal output circuit 5 according to the third exemplary embodiment. The respective operations performed from time t1 to time t9 can be similar to the respective operations performed from time t1 to time t9 described in the description of the first exemplary embodiment with reference to FIG. 5. The term "RMP_st1" will be used in the third exemplary embodiment to refer to the ramp start potential acquired by setting the control pulse PRMP_STN to the H level at time t5. Further, the term "RMP_off1" will be used to refer to the offset amount that is the difference between the ramp start potential RMP_st1 and the amplification reference signal VREF.

In the first exemplary embodiment, the control pulse PRMP_STN is set to the H level at time t10, but in the third exemplary embodiment, the control pulse PRMP_STS is set to the H level while the control pulse PRMP_STN is maintained at the L level at time t10-1. As mentioned above, the three voltages supplied by the voltage supply unit 60-3 satisfy the relational expression (VDAC_STS>VDAC_REF>VDAC_STN). Therefore, the potential of the signal VRMP shifts relative to the amplification reference signal VREF in the opposite direction from the shift caused when the control pulse PRMP_STN is set to the H level. In other words, the potential of the signal VRMP shifts in the same direction as the direction in which the signal VRMP varies depending on time during an AD conversion. The term "RMP_st2" will be used to refer to the ramp start potential at this time. Further, the term "RMP_off2" will be used to refer to the offset amount that is the difference between the ramp start potential RMP_st2 and the amplification reference signal VREF. The ramp start potential RMP_st2 corresponds to a third potential, which is a different potential from both the amplification reference signal VREF as the first potential and the ramp start potential RMP_st1 as the second potential.

At time t11-1, the control pulse PRMP_EN is set to the H level. As a result, the potential of the signal VRMP starts to vary from the ramp start potential RMP_st2 depending on time. The generated ramp waveform of the signal VRMP is the inclination D illustrated in FIG. 8. The broken line C indicates the ramp waveform of the signal VRMP that would be generated if the control pulse PRMP_STS is not set to the H level while the control pulses PRMP_STN and PRMP_EN are set to the H level at time t10-1, and this ramp waveform is illustrated in FIG. 8 for a comparison purpose.

Suppose that the magnitude relationship between the signal input into the input terminal INN of the differential amplification circuit 30 and the signal input into the input terminal INP is reversed at time t12-1 when the potential of the signal VRMP varies according to the ramp waveform D. At this time, a change occurs in the signal value of the latch signal LATCH output by the comparison unit 4. The memory 6 holds the S signal, which is the signal value of the count signal CNT at this time. On the other hand, suppose that the potential of the signal VRMP varies according to the ramp waveform C, provided that the same signal value is input into the input terminal INN of the differential amplification circuit 30. In this case, a change occurs in the signal value of the latch signal LATCH output from the comparison unit 4 at time t12-3. Therefore, the signal VRMP having the potential varying according to the ramp waveform D can speed up the timing when the signal value of the latch signal LATCH changes, compared to the signal VRMP having the potential varying according to the ramp waveform C.

At time t13-1, the potential of the signal VRMP reaches a potential RMP_end2. At this time, the control pulse PRMP_EN is set to the L level, as a result of which the potential of the signal VRMP stops varying. Further, at time t13-1, the control pulse PRMP_STS is set to the L level, and the control pulse PRMP_REF is set to the H level. In a case where the potential of the signal VRMP varies according to the ramp waveform C, the potential reaches a potential RMP_end1 at time t13-1. Therefore, even if a potential between the potential RMP_end2 and the potential RMP_end1 is supplied to the input terminal INP of the differential amplification circuit 30, the signal value of the latch signal LATCH can be changed by causing the potential of the signal VRMP to vary according to the ramp waveform D.

The value of the offset amount RMP_off2 in the third exemplary embodiment can be arbitrarily set. In one embodiment, the magnitude relationship between the potentials respectively supplied to the input terminals INP and INN of the differential amplification circuit 30 is reversed at a time between time t11-1 and time t13-1. If the potential supplied to the input terminal INP is already smaller than the potential supplied to the input terminal INN at time t11-1, the magnitude relationship cannot be changed during the period in which the signal VRMP is varying.

To avoid this situation, for example, an optical black pixel (hereinafter referred to as "OB pixel") may be prepared by blocking light at a part of the pixels arranged in the plurality of rows and the plurality of columns, and the value of the offset amount RMP_off2 may be set based on the signal output from the OB pixel. The signal output from the OB pixel is a signal containing the noise component of the pixel 100. In other words, the OB pixel outputs a signal having substantially the same potential as the pixel reference signal. The noise component is superimposed on the image signal output from the pixel 100. Since the pixel signal PIXOUT is a signal based on an electric charge, the potential of the image signal is generally smaller due to the noise component superimposed thereon, compared to the pixel reference signal.

Therefore, it is possible to reduce the possibility that the signal value of the latch signal LATCH may have no change during the period from time t11-1 to time t13-1, by setting the value of the offset amount RMP_off2 based on the potential of the signal output from the OB pixel.

Further, besides the signal output from the OB pixel, the offset amount RMP_off may be set based on the signal value of the N signal acquired by an AD conversion performed before time t0 illustrated in FIG. 10 (for example, an AD conversion performed for a row prior to the row of the pixel 100 for which the AD conversion is performed in FIG. 10).

The third exemplary embodiment has been described based on an example in which the potential of the signal VRMP varies to the potential RMP_end2 according to the ramp waveform D. However, the potential of the signal VRMP may vary to the potential RMP_end1 although the signal VRMP has the ramp waveform D. In other words, the control pulse PRMP_EN may be set to the L level at time 12-2. In this case, the AD conversion period can be reduced by the period from time t13-1 to time 12-2.

Further, the current source 55 in the third exemplary embodiment may be a variable current source. The current source 55 configured as a variable current source can change the inclination of the signal VRMP. Changing the inclination of the signal VRMP can change the gain of the signal output from the AD conversion unit 11 relative to the pixel output signal PIXOUT.

A fourth exemplary embodiment will be described with reference to the drawings, focusing on differences from the first exemplary embodiment. FIG. 11A is a block diagram illustrating an example of an imaging device according to the fourth exemplary embodiment. In FIG. 11A, components that function in similar manners to the components illustrated in FIG. 1 are indicated by the same reference numerals as those in FIG. 1.

The imaging device according to the fourth exemplary embodiment is configured in such a manner that the pixel output signal PIXOUT output from the pixel array 1 is output to the comparison unit 4 via an amplification unit 13. The ramp signal output circuit 5 in the fourth exemplary embodiment can be configured in a similar manner to the first exemplary embodiment.

Figure 11B:
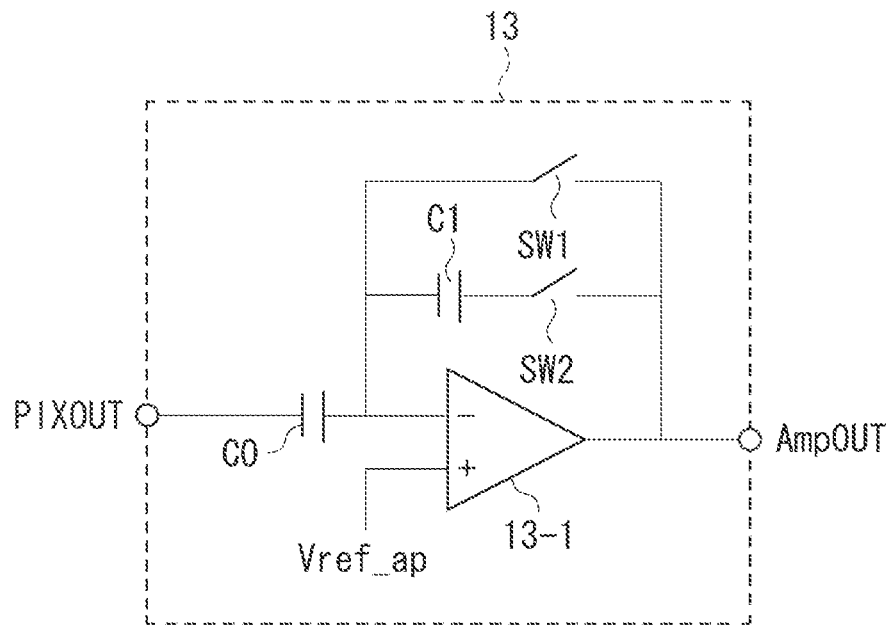
FIG. 11B is a block diagram illustrating an example of an amplification unit.

FIG. 11B is an equivalent circuit schematic illustrating the details of the amplification unit 13. The amplification unit 13 includes a differential amplification circuit 13-1, an amplification unit input capacitance C0, and a feedback capacitance C1. The differential amplification circuit 13-1 corresponds to a second differential amplification circuit. The pixel output signal PIXOUT is input into an inverting terminal of the differential amplification circuit 13-1 via the amplification unit input capacitance C0. The feedback capacitance C1 is electrically connected to an output terminal of the differential amplification circuit 13-1 via a gain changeover switch SW2. Further, the feedback capacitance C1 is electrically connected to the inverting terminal of the differential amplification circuit 13-1.

The term "amplification unit output signal AmpOUT" will be used to refer to the signal output from the differential amplification circuit 13-1. The gain of the amplification unit output signal AmpOUT relative to the pixel output signal PIXOUT is provided based on the ratio of the amplification unit input capacitance C0 and the sum of the capacitance value of the feedback capacitance C1 that is electrically connected to the output terminal of the differential amplification circuit 13-1. Hereinafter, a description will be given assuming that the gain changeover switch SW2 is turned on. When a switch SW1 of the differential amplification circuit 13-1 is set into a conduction state, the potentials of the differential amplification circuit 13-1 and the amplification unit input capacitance C0 are reset. The switch SW1 is turned on when an amplification unit rest pulse Amp_rst is set to the H level, and is turned off when the amplification unit rest pulse Amp_rst is set to the L level.

Figure 11C:
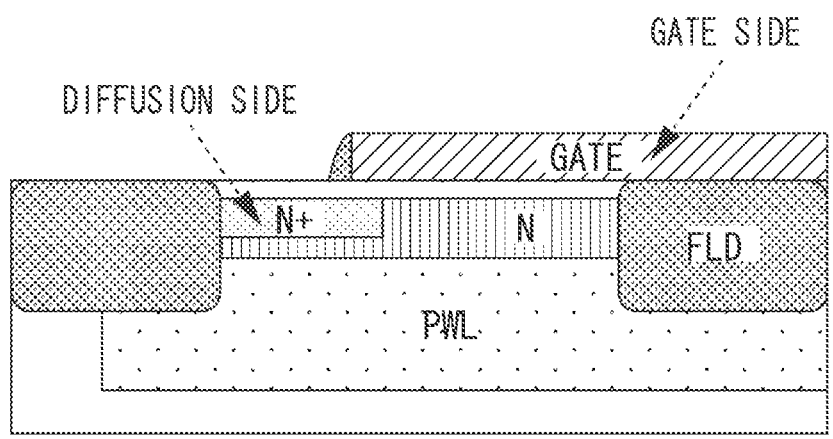
FIG. 11C schematically illustrates an example of the structure of a feedback capacitative element and an integral capacitative element.

FIG. 11C illustrates the structure of the feedback capacitance C1 and the integral capacitance 51 according to the fourth exemplary embodiment. In the fourth exemplary embodiment, both the feedback capacitance C1 of the amplification unit 13 and the integral capacitance 51 of the ramp signal output circuit 5 use a diffusion capacitance. The diffusion capacitance has a Metal-Insulator-Semiconductor (MIS) structure. A gate-side electrode (GATE) is a metal or polysilicon. The diffusion layer-side electrode (N+ and N) is an N-type semiconductor region. A P-type well (PWL) is a P-type semiconductor region. A field (FLD) is an insulating layer.

Further, the feedback capacitance C1 is electrically connected at any one of the gate-side electrode and the diffusion layer-side electrode thereof to the input terminal of the differential amplification circuit 13-1. The other electrode is electrically connected to the output terminal of the differential amplification circuit 13-1. Further, the integral capacitance 51 is electrically connected, at the same electrode thereof as the electrode of the feedback capacitance C1 electrically connected to the input terminal of the differential amplification circuit 13-1, to the input terminal of the differential amplification circuit 50. In other words, the feedback capacitance C1 is electrically connected at a homopolar electrode to the differential amplification circuit 13-1. For example, in a case where the feedback capacitance C1 is electrically connected at the gate-side electrode thereof to the input terminal of the differential amplification circuit 13-1, the integral capacitance 51 is also electrically connected at the gate-side electrode thereof to the input terminal of the differential amplification circuit 50. The other electrode of the integral capacitance 51 is electrically connected to the output terminal of the differential amplification circuit 50.

In this way, the feedback capacitance C1 and the integral capacitance 51 are similarly configured, and their homopolar electrodes are electrically connected to the input terminals of the differential amplification circuits 13-1 and 50, respectively. Similarly, the other homopolar electrodes are electrically connected to the output terminals of the differential amplification circuits 13-1 and 50, respectively. As a result, it is possible to uniform the voltage dependency of the capacitance value between the amplification unit 13 and the ramp signal output circuit 5. Further, it is possible to uniform the linearity, which is the relationship of an output signal to an input signal, between the amplification unit 13 and the ramp signal output circuit 5 by configuring the circuits of the differential amplification circuits 13-1 and 50 in a similar manner. Accordingly, it is possible to uniform the linearity between the amplification unit output signal AmpOUT and the signal VRMP.

Figure 12:
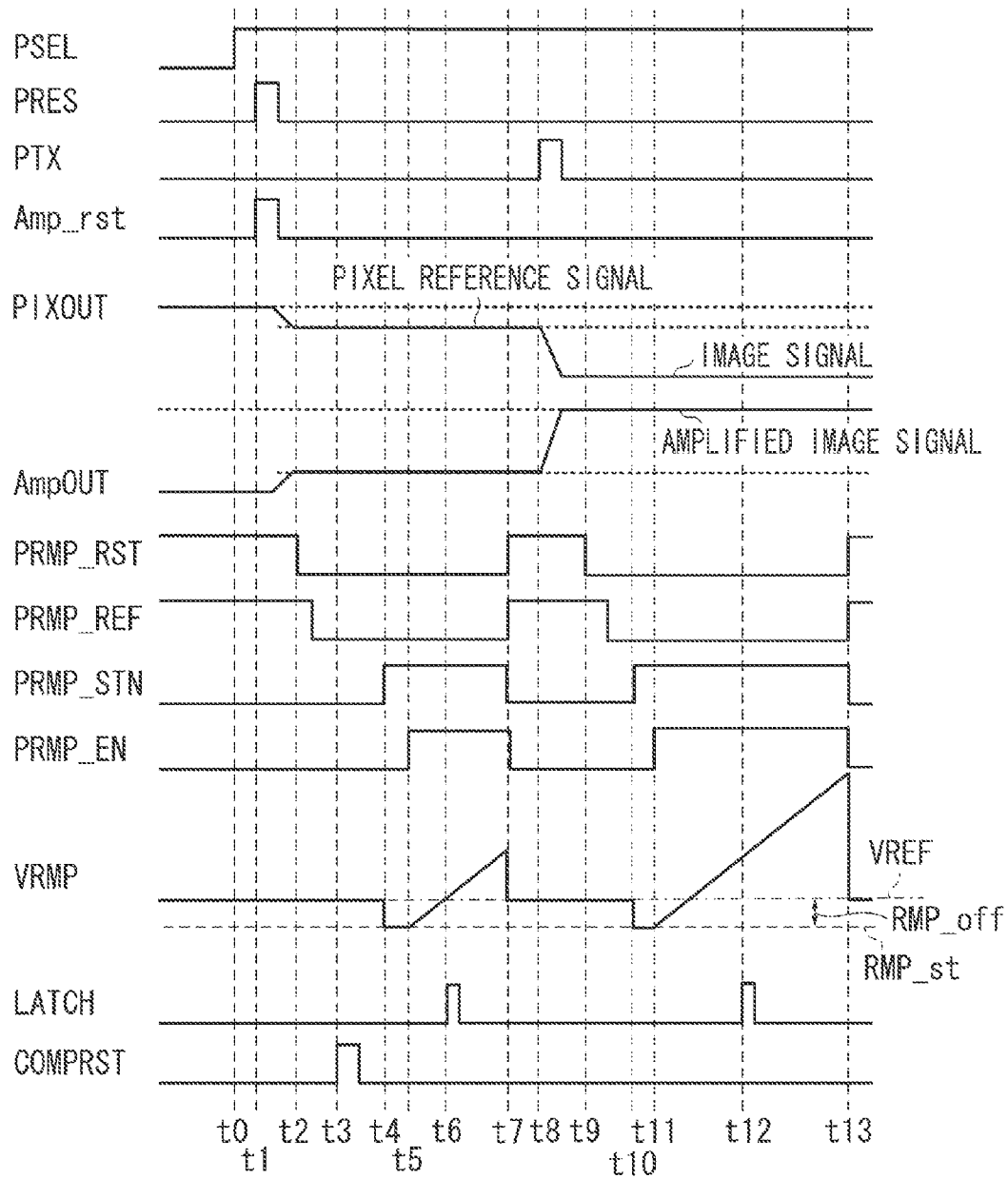
FIG. 12 is an operation timing diagram illustrating another example of the operation of the imaging device.

FIG. 12 is an operation timing diagram illustrating an example of the operation of the imaging device illustrated in FIG. 11A. The operation when the pixel 100 outputs the pixel output signal PIXOUT can be performed in a similar manner to the operation timing illustrated in FIG. 5. The following description will be provided, mainly focusing on differences from the operation timing illustrated in FIG. 5.

At time t1, an amplification unit reset pulse Amp_rst is set to the H level, thereby resetting the potentials of the differential amplification circuit 13-1 and the amplification unit input capacitance C0. After that, the amplification unit reset pulse Amp_rst is set to the L level. As a result, the electric charge based on the potential of the pixel output signal PIXOUT when the amplification unit reset pulse Amp_rst is set to the L level is held in the amplification unit input capacitance C0.

At time t2, the pixel reference signal is output to the vertical output line 3. The potential as the difference between the potential held in the amplification unit input capacitance C0 and the pixel reference single is supplied to the inverting terminal of the differential amplification circuit 13-1. This potential is amplified, and is then output as the amplification unit output signal AmpOUT. Further, the control pulse PRMP_RST is changed from the H level to the L level.

At time t3, the comparison unit reset pulse COMPRST is set to the H level, and then is set to the L level. As a result, the amplification unit output signal AmpOUT at time t3 is held in the comparison unit input capacitance 34. In other words, an offset component of the amplification unit 13 of each column is held in the comparison input capacitance 34 at this time. The amplification reference signal VREF is held in the comparison input capacitance 33 in a similar manner to the first exemplary embodiment.

At time t4, the control pulse PRMP_STN is set to the H level. In the fourth exemplary embodiment, the pixel output signal PIXOUT is supplied to the comparison unit 4 after the amplification unit 13 reverses and amplifies the pixel output signal PIXOUT. Therefore, during an AD conversion, the inclination of a change of the signal VRMP is inclined in an opposite direction from the inclination in the first exemplary embodiment. Accordingly, the signal VRMP is also shifted to the ramp start potential RMP_st in an opposite direction from the direction in the first exemplary embodiment.

At time t5, the control pulse PRMP_EN is set to the H level. As a result, the potential of the signal VRMP starts to vary depending on time. As described above, the direction of the change of the signal VRMP is the opposite direction from the first exemplary embodiment. In other words, the potential varies in an increasing direction depending on time.

After that, the operations at times t6 and t7 can be performed in similar manners to the operations at times t6 and t7 in the first exemplary embodiment illustrated in FIG. 5, respectively.

At time t8, the transfer pulse PTX is set to the H level. Then, the image signal is output to the vertical output line 3. The potential corresponding to the difference between the image signal and the potential held in the amplification unit input capacitance C0 is supplied to the inverting terminal of the differential amplification circuit 13-1. The differential amplification circuit 13-1 outputs the amplification unit output signal AmpOUT generated by reversing and amplifying the input potential. The term "amplified image signal" will be used to refer to the amplification unit output signal AmpOUT at this time. The potential corresponding to the difference between the amplified image signal and the potential held in the comparison unit input capacitance 34 is supplied to the input terminal INN of the differential amplification circuit 30. Therefore, it is possible to subtract the offset component of the amplification unit 13 of each column from the amplified image signal.

The operations at times t9 to t13 can be performed in similar manners to the operations at times t9 to t13 in the first exemplary embodiment illustrated in FIG. 5, respectively. In this way, it is possible to perform an AD conversion on the signal that the amplification unit 13 generates by reversing and amplifying the pixel output signal PIXOUT.

The amplification unit 13 in the fourth exemplary embodiment includes the feedback capacitance C1. The amplification unit 13 is configured in a similar manner to the capacitance feedback amplification circuit 61 of the ramp signal output circuit 5. The feedback capacitance C1 and the integral capacitance 51 are configured in a similar manner, and the homopolar electrodes thereof are electrically connected to the input terminals of the differential amplification circuits 13-1 and 50, respectively. Similarly, the other homopolar electrodes thereof are also electrically connected to the output terminals of the differential amplification circuits 13-1 and 50, respectively. As a result, it is possible to uniform the voltage dependency with which the capacitance depends on voltage between the amplification unit 13 and the ramp signal output circuit 5. Further, it is possible to uniform the linearity, which is the relationship of an output signal to an input signal, between the amplification unit 13 and the ramp signal output circuit 5 by configuring the respective circuits of the differential amplification circuits 13-1 and 50 in a similar manner. Accordingly, it is possible to uniform the linearity between the amplification unit output signal AmpOUT and the signal VRMP. As a result, it is possible to maintain the accuracy of AD conversion, which would be otherwise deteriorated due to a difference in the linearity between the amplification unit output signal AmpOUT and the signal VRMP.

The fourth exemplary embodiment has been described based on an example in which the feedback capacitance C1 and the integral capacitance 51 are configured as MIS capacities by way of example. As another example, each of the feedback capacitance C1 and the integral capacitance 51 may be configured as a Metal-Insulator-Metal (MIM) capacitance, or a polysilicon-polysilicon capacitance including two polysilicon layers with an insulating layer sandwiched therebetween. Also in such an example, the feedback capacitance C1 and the integral capacitance 51 are configured in a similar manner, and homopolar electrodes are electrically connected to the input and output terminals of the differential amplification circuits 13-1 and 50, respectively. Configuring them in a similar manner means that, for example, the feedback capacitance C1 and the integral capacitance 51 are both configured as MIM capacities. It is possible to uniform the voltage dependency of the capacitance value between the amplification unit 13 and the ramp signal output circuit 5, by configuring them in this way.

Figure 13:
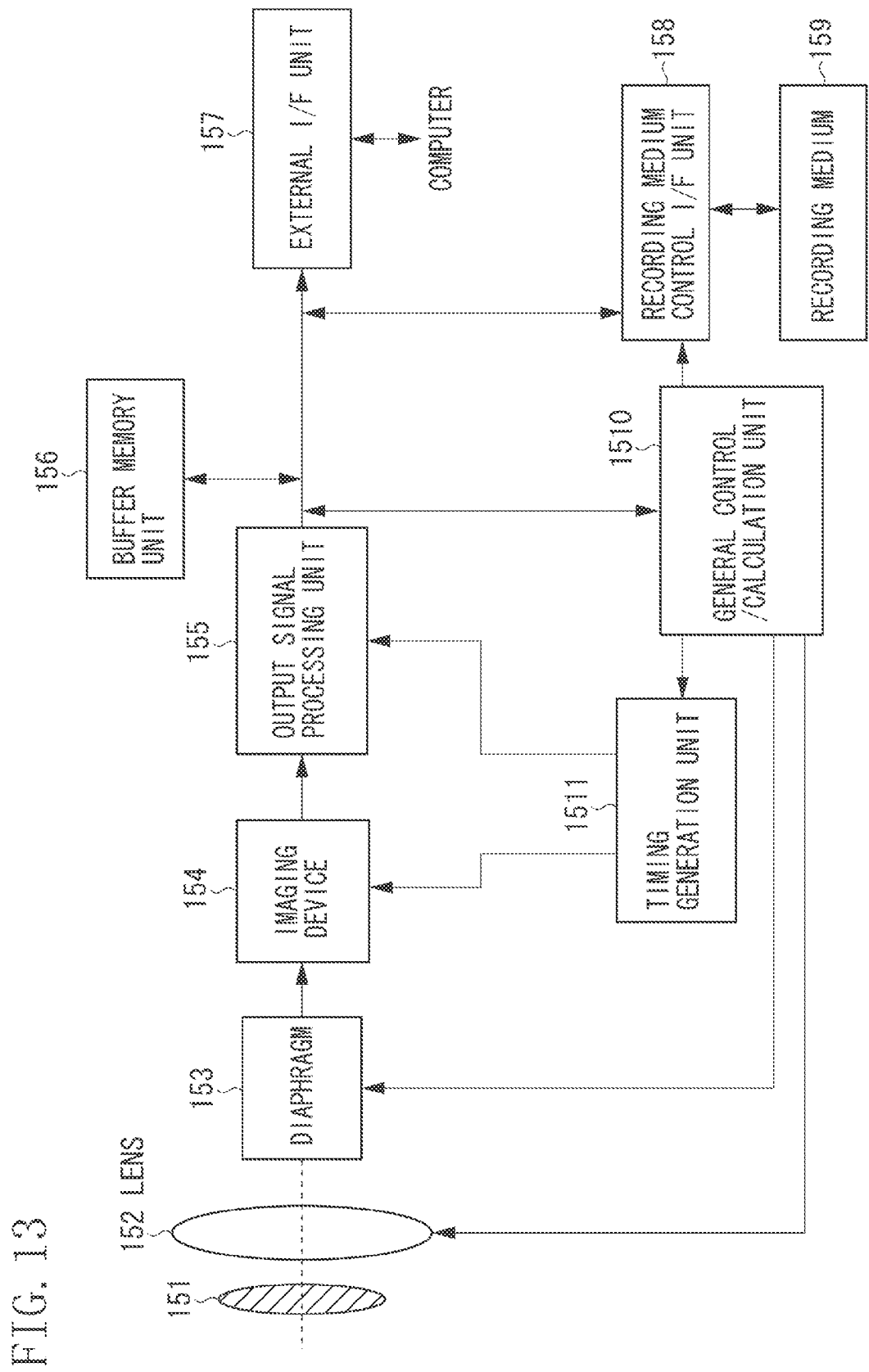
FIG. 13 is a block diagram illustrating an example of an imaging system.
Figure 14:
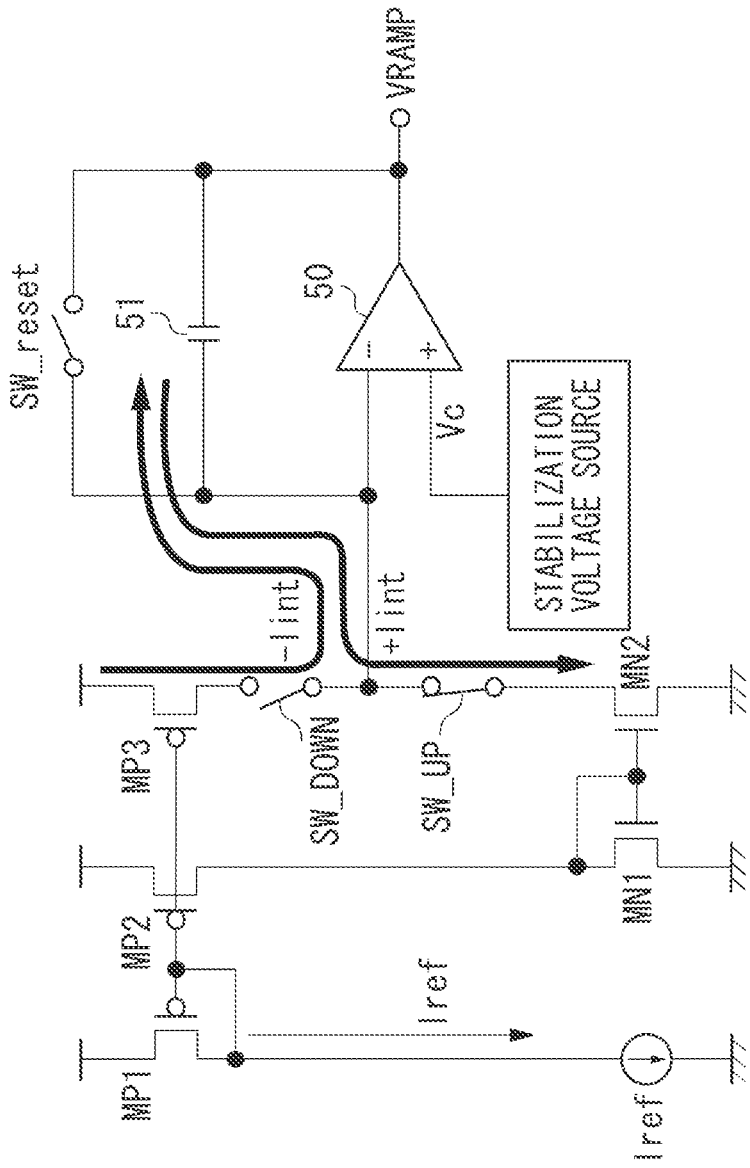
FIG. 14 is an equivalent circuit schematic illustrating a conventional ramp signal output circuit.

A fifth exemplary embodiment will be described as an example in which the above-described imaging device is applied to an imaging system. Examples of imaging systems include a digital still camera, a digital camcorder, and a monitoring camera. FIG. 13 schematically illustrates a digital still camera to which the imaging device is applied, as an example of imaging systems.

Referring to FIG. 13, a barrier 151 protects a lens 152. The lens 152 focuses an optical image of an object to an imaging device 154. A diaphragm 153 varies an amount of light transmitted through the lens 152. An output signal processing unit 155 processes an output signal output from the imaging device 154. The output signal processing unit 155 includes a digital signal processing unit, and performs various types of corrections and compressions on a signal output from the imaging device 154 as necessary to output a signal.

Referring to FIG. 13, a buffer memory unit 156 temporarily stores image data. An interface unit 158 enables recording on and reading from a recording medium. A recording medium 159, for example, a semiconductor memory, is detachably attached to the digital still camera, and imaged data is recorded on and read from the recording medium 159. An interface unit 157 enables communication with, for example, an external computer. A general control/calculation unit 1510 performs various types of calculations, and controls the entire digital still camera. A timing generation unit 1511 outputs various types of timing signals to the imaging device 154 and the output signal processing unit 155. However, for example, the timing signal may be input from the outside, and the imaging system has only to include at least the imaging device 154, and the output signal processing unit 155 for processing an output signal output from the imaging device 154.

In this way, the imaging system according to the fifth exemplary embodiment can perform an imaging operation by employing the imaging device 154.

While the disclosure has been described with reference to exemplary embodiments, it is to be understood that the disclosure is not limited to the disclosed exemplary embodiments. The scope of the following claims is to be accorded the broadest interpretation so as to encompass all modifications, equivalent structures, and functions.

This application claims priority from Japanese Patent Application No. 2011-223298 filed Oct. 7, 2011, which is hereby incorporated by reference herein in its entirety.

What is claimed is:

1. A circuit configured to output a ramp signal having a potential varying depending on time, the circuit comprising:
   a voltage supply unit configured to supply a plurality of voltages having different amplitudes;
   a current supply unit;
   an integration circuit configured to output the ramp signal; and
   a capacitive element,
   wherein the voltage supply unit is connected to one terminal of the capacitive element, and
   wherein the integration circuit and the current supply unit are connected to another terminal of the capacitive element.

2. The circuit according to claim 1, wherein the integration circuit includes a differential amplification unit, and an integral capacitance disposed at a feedback path connecting an output terminal and an input terminal of the differential amplification unit,
   wherein the ramp signal is output from the output terminal of the differential amplification unit.

3. The circuit according to claim 2, wherein the differential amplification unit includes a second input terminal to which a reference voltage is input, in addition to the input terminal, and
   wherein the current supply unit is connected to the input terminal.

4. The circuit according to claim 2, wherein the current supply unit includes a current source, a first transistor, and a second transistor,
   wherein the current source and the input terminal are connected to each other via the first transistor, and
   wherein the voltage supply unit and the current source are connected to each other via the second transistor, and the current source is connected to control electrodes of the respective first and second transistors.

5. An imaging device comprising:
   an apparatus comprising:
      the circuit according to claim 2,
      a plurality of comparison units each configured to output a comparison result signal indicating a result of a comparison between the potential based on the ramp signal and a potential of an analog signal;
      a counter configured to output a count signal by counting a clock pulse signal; and
      a plurality of memories each configured to be input the count signal from the counter and the comparison result signal from the comparison unit, the memories being disposed corresponding to the plurality of comparison units,
   wherein the count signal is commonly input to the plurality of memories, and
   wherein each of the memories holds the count signal input from the counter based on the comparison result signal output from the comparison unit, to convert the analog signal to a digital signal; and
   a pixel array including pixels arranged in a plurality of rows and a plurality of columns, each of the pixels being configured to photoelectrically convert incident light to output a signal,
   wherein the potential of the analog signal is a potential based on the signal output from the pixel,
   wherein the plurality of comparison units is disposed corresponding to the columns of the pixels,
   wherein the imaging device further comprising an amplification unit including a second differential amplification unit, and a feedback capacitance disposed on a feedback path connecting an output terminal and an input terminal of the second differential amplification unit,
   wherein the signal output from the pixel is amplified by the amplification unit, and is then input into the comparison unit,
   wherein the feedback capacitance and the integral capacitance have similar structures, and
   wherein an electrode of the feedback capacitance connected to the input terminal of the second differential amplification unit of the amplification unit, and an electrode of the integral capacitance connected to the input terminal of the differential amplification unit are homopolar.

6. An imaging device comprising:
   an apparatus comprising:
      the circuit according to claim 2;
      a plurality of comparison units each configured to output a comparison result signal indicating a result of a comparison between the potential based on the ramp signal and a potential of an analog signal; and
      a plurality of memories each configured to be input the comparison result signal from the comparison unit, the memories being disposed corresponding to the plurality of comparison units,
   wherein each of the plurality of memories further includes a counter configured to generate a count signal by counting a clock pulse signal, and
   wherein each of the memories holds the count signal generated by the counter based on the comparison result signal output from the comparison unit, to convert the analog signal to a digital signal; and
   a pixel array including pixels arranged in a plurality of rows and a plurality of columns, each of the pixels being configured to photoelectrically convert incident light to output a signal,
   wherein the potential of the analog signal is a potential based on the signal output from the pixel,
   wherein the plurality of comparison units is disposed corresponding to the columns of the pixels,
   wherein the imaging device further comprising an amplification unit including a second differential amplification unit, and a feedback capacitance disposed on a feedback path connecting an output terminal and an input terminal of the second differential amplification unit, wherein the signal output from the pixel is amplified by the amplification unit, and is then input into the comparison unit, wherein the feedback capacitance and the integral capacitance have similar structures, and wherein an electrode of the feedback capacitance connected to the input terminal of the second differential amplification unit of the amplification unit, and an electrode of the integral capacitance connected to the input terminal of the differential amplification unit are homopolar.

7. An apparatus comprising:
the circuit according to claim 1;
a plurality of comparison units each configured to output a comparison result signal indicating a result of a comparison between the potential based on the ramp signal and a potential of an analog signal;
a counter configured to output a count signal by counting a clock pulse signal; and
a plurality of memories each configured to be input the count signal from the counter and the comparison result signal from the comparison unit, the memories being disposed corresponding to the plurality of comparison units,
wherein the count signal is commonly input to the plurality of memories, and
wherein each of the memories holds the count signal input from the counter based on the comparison result signal output from the comparison unit, to convert the analog signal to a digital signal.

8. A method for driving the apparatus according to claim 7, the method comprising:
supplying the voltage from the voltage supply unit to the integration circuit via the capacitive element;
shifting a potential of a signal output from the integration circuit from a first potential to a second potential different from the first potential by changing a voltage value supplied from the voltage supply unit to the integration circuit via the capacitive element;
supplying a current from the current supply unit to the integration circuit and the capacitive element; and
outputting the ramp signal having the potential varying from the second potential, from the integration circuit.

9. The method for driving the apparatus according to claim 8, the plurality of comparison units each including a third input terminal to which the potential based on the ramp signal is input, and a fourth input terminal to which the potential of the analog signal is input, the method further comprising:
resetting a potential of the third input terminal based on the first potential;
comparing the potential based on the ramp signal having the potential varying from the second potential with a signal of a noise component by the plurality of comparison units; and
outputting, from the integration circuit, the ramp signal having the potential varying from a third potential different from both the first and second potentials after shifting to the third potential, based on the voltage supplied from the voltage supply unit via the capacitive element, in the comparison between the potential based on the ramp signal and the potential of the analog signal.

10. An imaging device comprising:
the apparatus according to claim 9; and
a pixel array including pixels arranged in a plurality of rows and a plurality of columns, each of the pixels being configured to photoelectrically convert incident light to output a signal, wherein the potential of the analog signal is a potential based on the signal output from the pixel, and wherein the plurality of comparison units is disposed corresponding to the columns of the pixels.

11. A method for driving the imaging device according to claim 10, the plurality of pixels partially including an optical black pixel shielded from the incident light, the method comprising:
supplying the voltage from the voltage supply unit to the integration circuit via the capacitive element;
shifting a potential of a signal output from the integration circuit from a first potential to a second potential, which is different from the first potential and is set based on the signal output from the optical black pixel, by changing a voltage value supplied from the voltage supply unit to the integration circuit via the capacitive element;
supplying a current from the current supply unit to the integration circuit and the capacitive element; and
outputting, from the integration circuit, the ramp signal having the potential varying from the second potential.

12. An apparatus comprising:
the circuit according to claim 1;
a plurality of comparison units each configured to output a comparison result signal indicating a result of a comparison between the potential based on the ramp signal and a potential of an analog signal; and
a plurality of memories each configured to be input the comparison result signal from the comparison unit, the memories being disposed corresponding to the plurality of comparison units, the memories each further including a counter configured to generate a count signal by counting a clock pulse signal,
wherein each of the memories holds the count signal generated by the counter based on the comparison result signal output from the comparison unit, to convert the analog signal to a digital signal.

13. A method for driving the apparatus according to claim 12, the method comprising:
supplying the voltage from the voltage supply unit to the integration circuit via the capacitive element;
shifting a potential of a signal output from the integration circuit from a first potential to a second potential different from the first potential by changing a voltage value supplied from the voltage supply unit to the integration circuit via the capacitive element;
supplying a current from the current supply unit to the integration circuit and the capacitive element; and
outputting the ramp signal having the potential varying from the second potential, from the integration circuit.

14. The method for driving the apparatus according to claim 13, the plurality of comparison units each including a third input terminal to which the potential based on the ramp signal is input, and a fourth input terminal to which the potential of the analog signal is input, the method further comprising:
resetting a potential of the third input terminal based on the first potential;
comparing the potential based on the ramp signal having the potential further varying from the second potential with a signal of a noise component by the plurality of comparison units; and
outputting, from the integration circuit, the ramp signal having the potential varying from a third potential different from both the first and second potentials after shifting to the third potential, based on the voltage supplied from the voltage supply unit via the capacitive element, in the comparison between the potential based on the ramp signal and the potential of the analog signal.

15. An imaging device comprising:
the apparatus according to claim 12; and
a pixel array including pixels arranged in a plurality of rows and a plurality of columns, each of the pixels being configured to photoelectrically convert incident light to output a signal,
wherein the potential of the analog signal is a potential based on the signal output from the pixel, and
wherein the plurality of comparison units is disposed corresponding to the columns of the pixels.

16. A method for driving the imaging device according to claim 15, the plurality of pixels partially including an optical black pixel shielded from the incident light, the method comprising:
supplying the voltage from the voltage supply unit to the integration circuit via the capacitive element;
shifting a potential of a signal output from the integration circuit from a first potential to a second potential, which is different from the first potential and is set based on the signal output from the optical black pixel, by changing a voltage value supplied from the voltage supply unit to the integration circuit via the capacitive element;
supplying a current from the current supply unit to the integration circuit and the capacitive element; and
outputting, from the integration circuit, the ramp signal having the potential varying from the second potential.

17. A method for driving a circuit configured to output a ramp signal having a potential varying depending on time, the circuit comprising a current supply unit, an integration circuit, and a capacitive element, the method comprising:
shifting a potential of a signal output from the integration circuit from a first potential to a potential different from the first potential by changing a voltage value to be supplied to the integration circuit via the capacitive element;
supplying a current from the current supply unit to the integration circuit and the capacitive element; and
outputting the ramp signal, which has the potential varying from the potential different from the first potential, from the integration circuit.

18. The method for driving the circuit according to claim 17, wherein the circuit further comprises a voltage supply unit configured to supply a plurality of voltage values to the integration circuit via the capacitive element,
wherein the integration circuit includes a differential amplification unit, and an integral capacitance disposed on a feedback path connecting an output terminal and an input terminal of the differential amplification unit,
wherein the ramp signal is output from the output terminal of the differential amplification unit,
wherein the differential amplification unit includes a second input terminal to which a reference voltage is input, in addition to the input terminal,
wherein the current supply unit includes a current source, a first transistor, and a second transistor,
wherein the current source and the input terminal are connected to each other via the first transistor, and
wherein the voltage supply unit and the current source are connected to each other via the second transistor, and the current source commonly actuates control electrodes of the respective first transistor and the second transistor.

19. The method for driving the circuit according to claim 17, further comprising:
outputting a signal having a first potential from the integration circuit by supplying a first voltage to the capacitive element;
supplying any one of a plurality of voltages having voltage values different from one another, which are different from a voltage value of the first voltage, to the capacitive element to output a signal having a potential different from the first potential from the integration circuit;
outputting the ramp signal having a potential varying by a first variation amount per unit time from the integration circuit, in a case where a voltage having a voltage value of a small amplitude is supplied among the plurality of voltages; and
outputting the ramp signal having a potential varying by a variation amount larger than the first variation amount per unit time from the integration circuit, in a case where a voltage having a voltage value of a large amplitude is supplied among the plurality of voltages.

20. The method for driving the circuit according to claim 17, wherein the current supply unit does not supply the current to the integration circuit while the potential of the signal output from the integration circuit is shifted from the first potential to the potential different from the first potential.

* * * * *